(12) United States Patent
Joo et al.

(10) Patent No.: US 11,784,155 B2
(45) Date of Patent: Oct. 10, 2023

(54) SYSTEMS AND PROCESSES FOR INCREASING SEMICONDUCTOR DEVICE RELIABILITY

(71) Applicant: WOLFSPEED, INC., Durham, NC (US)

(72) Inventors: Sung Chul Joo, Cary, NC (US); Jack Powell, Wake Forest, NC (US); Donald Farrell, Raleigh, NC (US); Bradley Millon, Durham, NC (US)

(73) Assignee: WOLFSPEED, INC., Durham, NC (US)

( * ) Notice: Subject to any disclaimer, the term of this patent is extended or adjusted under 35 U.S.C. 154(b) by 2 days.

(21) Appl. No.: 17/702,868

(22) Filed: Mar. 24, 2022

(65) Prior Publication Data
US 2022/0216175 A1     Jul. 7, 2022

Related U.S. Application Data

(63) Continuation of application No. 16/597,224, filed on Oct. 9, 2019, now Pat. No. 11,289,441.

(51) Int. Cl.
*H01L 23/66*     (2006.01)
*H01L 23/00*     (2006.01)
(Continued)

(52) U.S. Cl.
CPC ............ *H01L 24/37* (2013.01); *H01L 23/562* (2013.01); *H01L 23/66* (2013.01); *H01L 24/35* (2013.01);
(Continued)

(58) Field of Classification Search
CPC ....... H01L 24/37; H01L 23/562; H01L 23/66; H01L 24/35; H01L 24/40; H01L 24/84; H01L 2223/6627; H01L 2224/37012; H01L 2224/40157; H01L 2924/19033; H01L 2924/35121; H01L 2224/37147; H01L 2224/37155; H01L 2224/3716; H01L 2224/40091; H01L 2224/84801; H01L 2924/10272; H01L 2924/1033;
(Continued)

(56) References Cited

U.S. PATENT DOCUMENTS

2010/0090330 A1    4/2010    Nakazato
2014/0070235 A1    3/2014    Andrews et al.
(Continued)

OTHER PUBLICATIONS

International Search Report and Written Opinion issued in PCT/US2020/046981, dated Nov. 9, 2020.
(Continued)

*Primary Examiner* — Elias Ullah
(74) *Attorney, Agent, or Firm* — BakerHostetler

(57) ABSTRACT

A system configured to increase a reliability of electrical connections in a device. The system including a lead configured to electrically connect a pad of at least one support structure to a pad of at least one electrical component. The lead includes an upper portion that includes a lower surface arranged on a lower surface thereof. The lower surface of the upper portion is arranged vertically above a first upper surface of a first pad connection portion; and the lower surface of the upper portion is arranged vertically above a second upper surface of the second pad connection portion. A process configured to increase a reliability of electrical connections in a device is also disclosed.

24 Claims, 23 Drawing Sheets

(51) Int. Cl.
  *H01P 11/00*  (2006.01)
  *H01P 3/00*  (2006.01)

(52) U.S. Cl.
  CPC .............. *H01L 24/40* (2013.01); *H01L 24/84* (2013.01); *H01P 3/003* (2013.01); *H01P 11/003* (2013.01); *H01L 2223/6627* (2013.01); *H01L 2224/37012* (2013.01); *H01L 2224/40157* (2013.01); *H01L 2924/19033* (2013.01); *H01L 2924/35121* (2013.01)

(58) Field of Classification Search
  CPC . H01L 2924/12032; H01L 2924/13064; H01L 2924/13091; H01L 2924/1421; H01L 2924/3025; H01L 2924/3512; H01L 23/4821; H01L 21/4885; H01L 23/4824; H01L 23/488; H01L 24/03; H01L 24/07; H01P 3/003; H01P 11/003; H01P 5/02; H01P 1/047; H05K 1/115
  See application file for complete search history.

(56) References Cited

U.S. PATENT DOCUMENTS

| | | |
|---|---|---|
| 2015/0001691 A1 | 1/2015 | Higgins, III |
| 2017/0125881 A1 | 5/2017 | Mangrum et al. |

OTHER PUBLICATIONS

International Patent Application No. PCT/US2020/046981; Int'l Preliminary Report on Patentability; dated Apr. 21, 2022; 12 pages.

SYSTEMS AND PROCESSES FOR INCREASING SEMICONDUCTOR DEVICE RELIABILITY

CROSS-REFERENCE TO RELATED APPLICATIONS

This application is a continuation of U.S. patent application Ser. No. 16/597,224, filed Oct. 9, 2019 now U.S. Pat. No. 11,289,441 issued Mar. 29, 2022, which is incorporated herein by reference in its entirety.

FIELD OF THE DISCLOSURE

The disclosure relates to systems for increasing semiconductor device reliability. The disclosure further relates to processes for increasing semiconductor device reliability.

BACKGROUND OF THE DISCLOSURE

Electrical components are typically supported on a structure having conductive tracks, pads, and other features. The electrical components are typically connected to the structure with leads. For example, the structure may be a printed circuit board (PCB) that mechanically supports and electrically connects the electrical components via the conductive tracks, the pads, and the other features. The electrical components are typically soldered onto the support structure through the leads to both electrically connect and mechanically fasten the electrical components to the support structure.

However, the electrical components and the support structure are often implemented in environments subjected to changes in temperature. Accordingly, the electrical components are often required to pass temperature cycle tests, thermal shock tests, and the like. In this regard, the thermal cycling of the electrical components and/or the support structure has been found to negatively impact the associated lead structure and its connections between the electrical components and the support structure. In particular, the thermal cycling of the electrical components and/or the support structure has been found to form defects such as cracks, fatigue features, fractures, delamination, and/or the like in the connection between the lead structure and a pad on which the lead structure is connected.

For example, it has been found that the leads connecting the electrical components and/or the support structure started showing cracks, fatigue features, fractures, delamination, and/or the like at a lead—solder interface during the temperature cycle tests. Moreover, the defects, such as delamination, became severely worse after 1000 cycles of the temperature cycle test. The electrical components and/or the support structure are required to pass temperature cycle tests, thermal shock tests, and the like. However, the above-noted defects at the lead—solder interface can result in the electrical components and/or the support structure failing such temperature cycle tests, thermal shock tests, and the like. Moreover, the above-noted defects at the lead—solder interface can result in the electrical components and/or the support structure subsequently resulting in a device failure, reducing the reliability thereof, and the like. For example, FIG. 21 illustrates a device 1 having a lead 2 that connects to a pad 3 on a support structure 4. Additionally, the lead 2 of the device 1 includes a pad 6 for connection of the lead 2 to an electrical component 7. FIG. 21 further illustrates that the device 1 has experienced a defect 8 in the form of a delamination. Likewise, Figure 22 further illustrates another device 1 that has experienced a defect 8 in the form of a crack. Similarly, FIG. 23 further illustrates another device 1 that has experienced a defect 8 in the form of a crack. The above-noted defects such as cracks, fatigue features, fractures, delamination, and/or the like in the connection can typically have a direct impact on the reliability of the device, a system implementing the device, and the like.

Accordingly, what is needed are systems and processes to reduce the occurrence of cracks, fatigue features, fractures, and/or the delamination at a lead—solder interface in electrical components and/or a support structure.

The disclosure provides systems and processes to address at least one root cause of cracks, fatigue features, fractures, and/or the delamination at a lead—solder interface (failure mode). In particular, the at least one root cause of the failure mode has been found to be in part solder fatigue during a temperature excursion.

SUMMARY OF THE DISCLOSURE

One general aspect includes a system configured to increase a reliability of electrical connections in a device, the system including: a lead configured to electrically connect a pad of at least one support structure to a pad of at least one electrical component; the lead includes a first pad connection portion that includes a first upper surface; the first pad connection portion configured to connect the lead to the pad of the at least one support structure; the lead includes a second pad connection portion that includes a second upper surface; the second pad connection portion configured to connect the lead to the pad of the at least one electrical component; the lead includes an upper portion that includes a lower surface arranged on a lower surface thereof; the upper portion being arranged between the first pad connection portion and the second pad connection portion; where the lower surface of the upper portion is arranged vertically above the first upper surface of the first pad connection portion; and where the lower surface of the upper portion is arranged vertically above the second upper surface of the second pad connection portion.

One general aspect includes a process configured to increase a reliability of electrical connections in a device, the process including: forming a lead that is configured to electrically connect a pad of at least one support structure to a pad of at least one electrical component; providing the lead with a first pad connection portion that includes a first upper surface; configuring the first pad connection portion to connect the lead to the pad of the at least one support structure; providing the lead with a second pad connection portion that includes a second upper surface; configuring the second pad connection portion to connect the lead to the pad of the at least one electrical component; arranging the lead to include an upper portion that includes a lower surface arranged on a lower surface thereof; arranging the upper portion between the first pad connection portion and the second pad connection portion; arranging the lower surface of the upper portion to be vertically above the first upper surface of the first pad connection portion; and arranging the lower surface of the upper portion to be arranged vertically above the second upper surface of the second pad connection portion.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
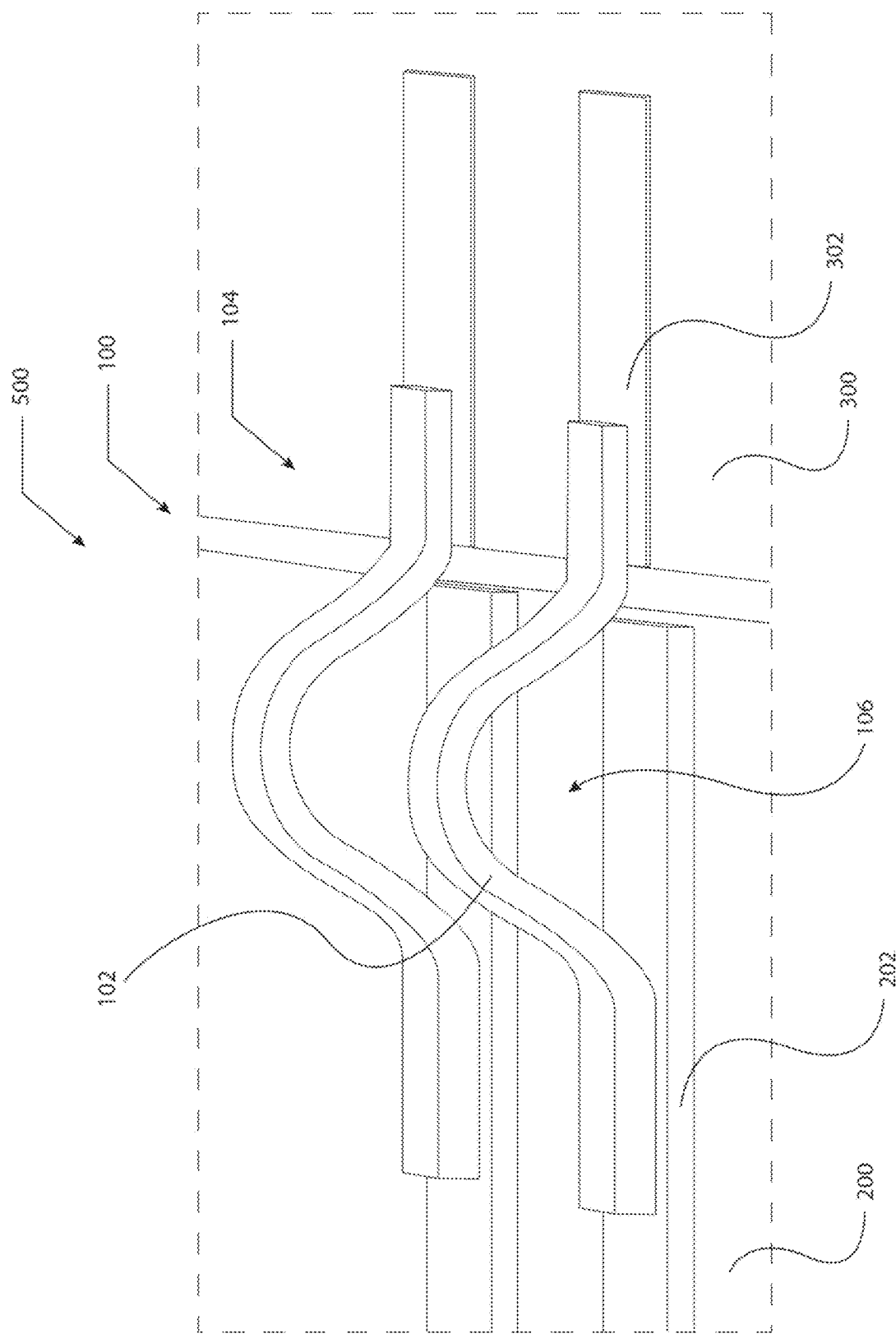
FIG. 1 illustrates a perspective side view of a system according to aspects of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a perspective side view of a system according to aspects of the disclosure.

Figure 2:
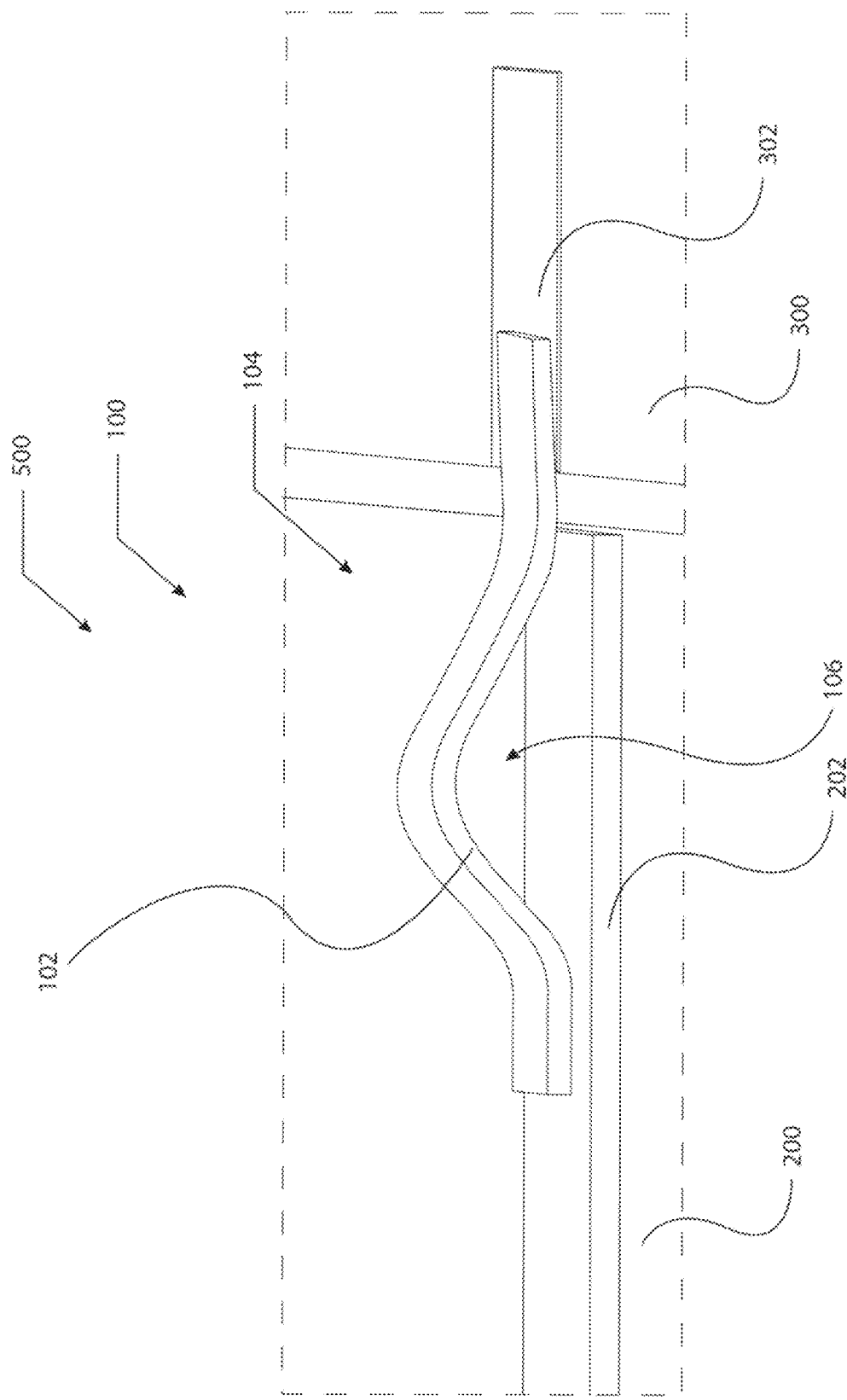
FIG. 2 illustrates a perspective side view of another system according to aspects of the disclosure.

FIG. 2 illustrates a perspective side view of another system according to aspects of the disclosure.

Figure 3:
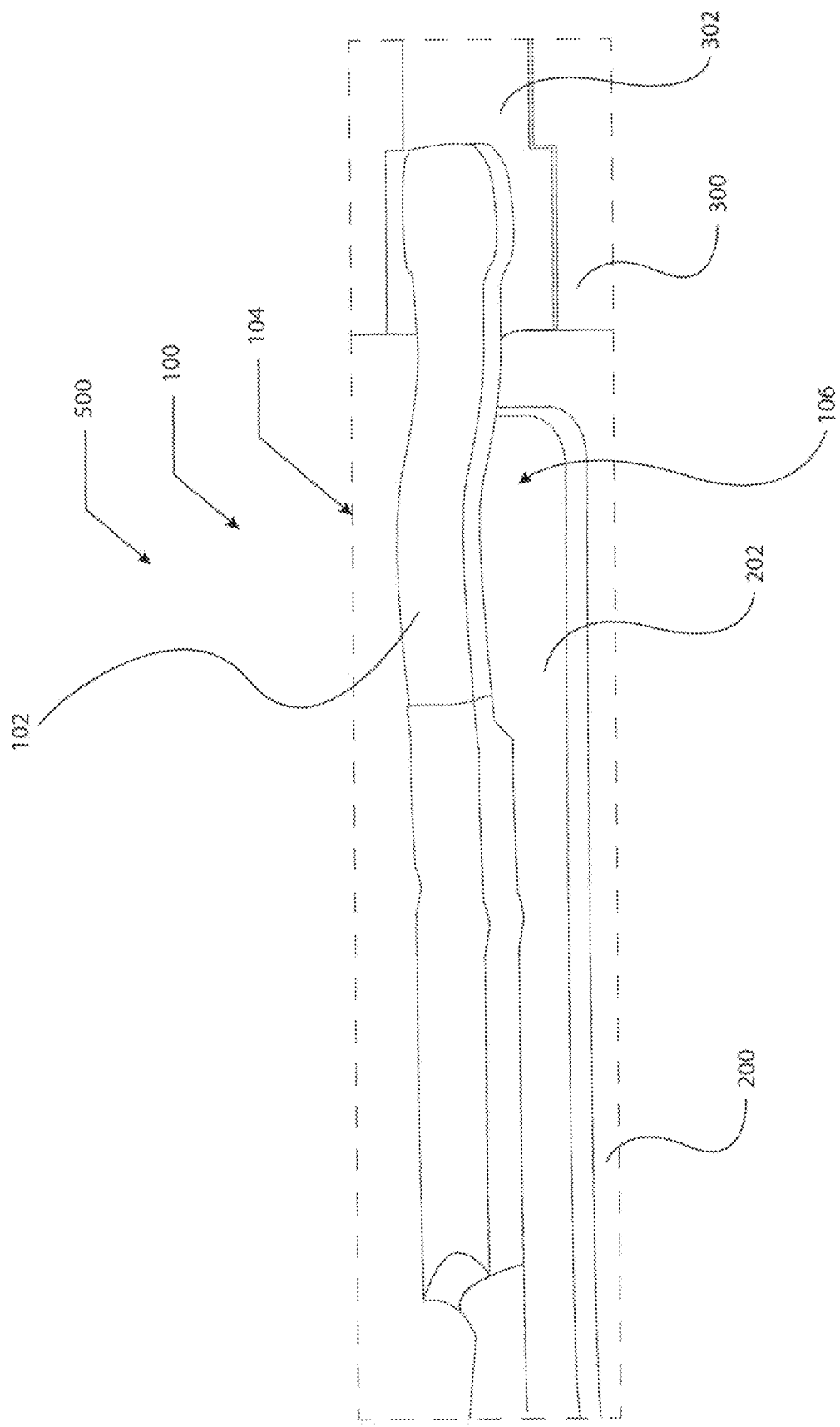
FIG. 3 illustrates a perspective side view of another system according to aspects of the disclosure.

FIG. 3 illustrates a perspective side view of another system according to aspects of the disclosure.

In particular, FIG. 1, FIG. 2, and FIG. 3 illustrate a system 100 configured to increase a reliability for various components in a device 500. The device 500 may include the system 100, at least one support structure 200, at least one electrical component 300, and the like. In other aspects, the system 100 may include the device 500, the at least one support structure 200, the at least one electrical component 300, and the like.

In particular, the system 100 may include at least one connection 104 between the at least one support structure 200 and the at least one electrical component 300. In one aspect, the system 100 may increase the reliability of the at least one connection 104 as further described below. The at least one support structure 200 may include a pad 202; and the at least one electrical component 300 may include a pad 302. The at least one connection 104 may be implemented by a lead 102 that electrically connects the pad 202 of the at least one support structure 200 to the pad 302 of the at least one electrical component 300. The at least one connection 104 may transmit signals and/or power through the lead 102 between the at least one support structure 200 and the at least one electrical component 300.

In one aspect, the lead 102 may include a stress relief feature 106. In one aspect, the lead 102 may include the stress relief feature 106 that may in part increase the reliability of at least one connection 104 and/or the device 500.

In one or more aspects, the lead 102 that includes the stress relief feature 106 may be implemented with various shapes. In this regard, the shapes may be defined as the cross-sectional shape as viewed in a plane containing the lead 102, the pad 202, and the pad 302, and the plane being perpendicular to an upper surface of the at least one support structure 200 and/or the upper surface of the at least one electrical component 300. The various shapes may include a generally curved shaped construction as illustrated in FIG. 1, a generally triangular shaped construction as illustrated in FIG. 2, a generally bow shaped construction as illustrated in FIG. 3, and the like.

The various shapes may also include an Aquiline shaped construction, a Bell-shaped curve construction, a Biconic shaped construction, a Bow curve shaped construction, a Bullet Nose shaped construction, a Cocked Hat curve shaped construction, a Bicorn shaped construction, a Serpentine shaped construction, an A-shaped construction (a shape that resembles the capital letter A), a D-shaped construction (a shape that resembles the capital letter D), a Circular sector shaped construction, a Circular segment shaped construction, a Crescent shaped construction, a Semicircle shaped construction, a polygonal shaped construction, a free-form shaped construction, and/or the like.

Figure 4:
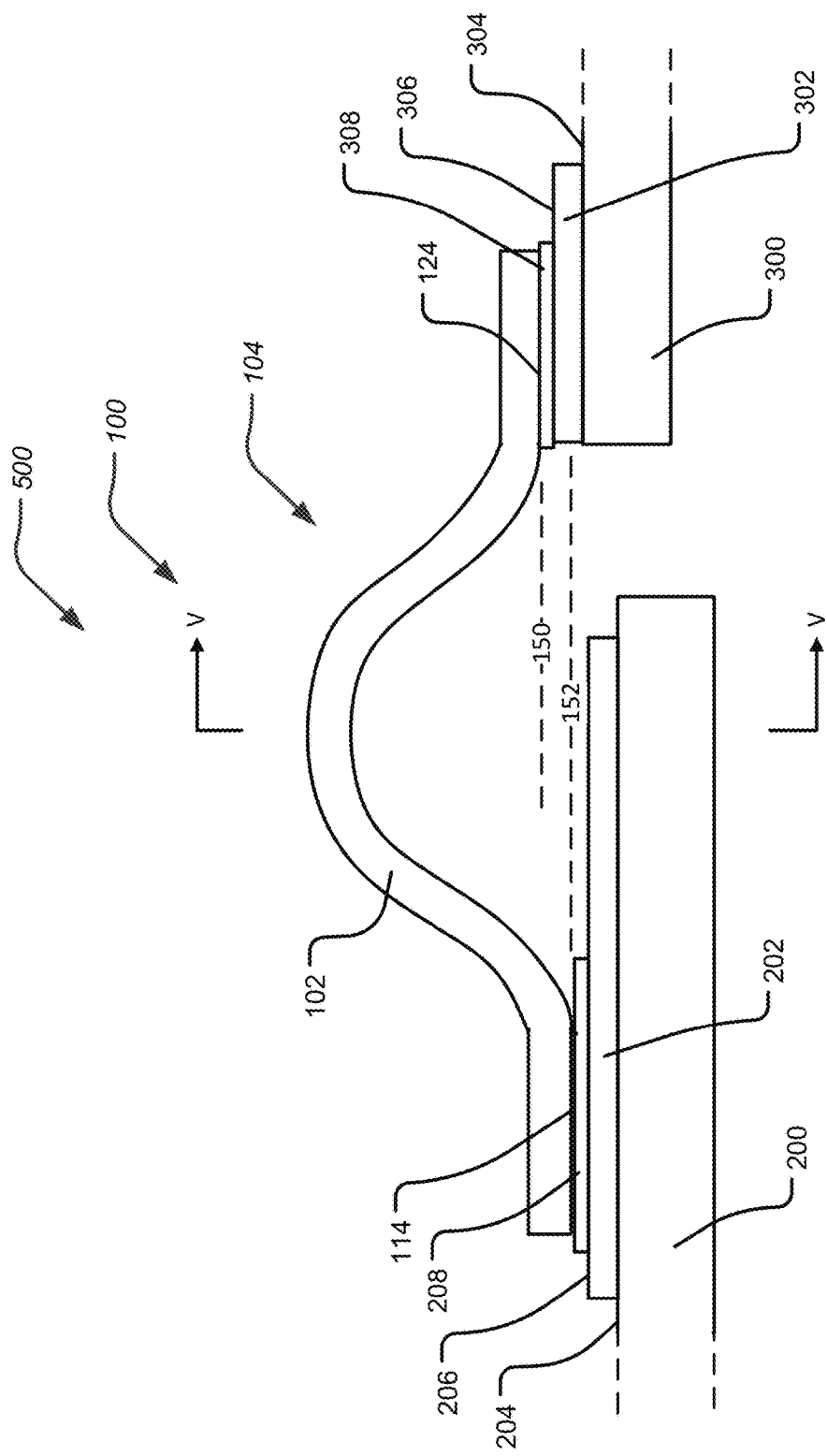
FIG. 4 illustrates a side view of the system according to FIG. 1.

FIG. 4 illustrates a side view of the system according to FIG. 1.

In particular, FIG. 4 illustrates the details of the system 100, the at least one support structure 200, the at least one electrical component 300, the device 500, and the like. Moreover, although FIG. 4 illustrates a particular shape of the lead 102, the various other shapes of the lead 102 as described herein may also likewise include the various details of the system 100, the at least one support structure 200, the at least one electrical component 300, the device 500, and the like as illustrated in FIG. 4.

In particular, the at least one support structure 200 may include an upper surface 204. In one aspect, the pad 202 may be arranged on the upper surface 204. In one aspect, the pad 202 may be arranged directly on the upper surface 204. In one aspect, the pad 202 may be arranged in the upper surface 204. In one aspect, the upper surface 204 of the at least one support structure 200 may be generally planar. In one aspect, an upper surface 206 of the pad 202 may be generally planar. On the pad 202, a lead—solder interface 208 may be formed between the lead 102 and the pad 202. In particular, the lead 102 may have a lower surface 114 and the lead—solder interface 208 may be formed between the lower surface 114 and the upper surface 206 of the pad 202.

FIG. 4 further illustrates that the at least one electrical component 300 may include an upper surface 304. In one aspect, the pad 302 may be arranged on the upper surface 304. In one aspect, the pad 302 may be arranged directly on the upper surface 304. In one aspect, the pad 302 may be arranged in the upper surface 304. In one aspect, the upper surface 304 of the at least one electrical component 300 may be generally planar. In one aspect, an upper surface 306 of the pad 302 may be generally planar. On the pad 302, a lead—solder interface 308 may be formed between the lead 102 and the pad 302. In particular, the lead 102 may have a lower surface 124 and the lead—solder interface 308 may be formed between the lower surface 124 and the upper surface 306 of the pad 302.

In one aspect, the lower surface 114 of the lead 102 may be located in a plane 152 and the lower surface 124 of the lead 102 may be located in a plane 150. The plane 152 and the plane 150 may be vertically offset as illustrated in FIG. 4. In one aspect, the lower surface 114 of the lead 102 may be located in the plane 152 and the lower surface 124 of the lead 102 may be located in the plane 150 and the plane 152 and the plane 150 may be vertically at the same vertical height (not shown).

In one aspect, the lead 102 may be formed of a metallic material. In one aspect, the lead 102 may be formed of a metallic material such as copper, a nickel-cobalt ferrous alloy, Kovar™, or the like.

In one aspect, the pad 202 arranged on the at least one support structure 200 may comprise a metallic material. In one aspect, the pad 202 arranged on the at least one support structure 200 may comprise a metallic material such as copper, gold, nickel, and the like, and combinations thereof.

In one aspect, the pad 302 arranged on the at least one electrical component 300 may comprise a metallic material. In one aspect, the pad 202 arranged on the at least one electrical component 300 may comprise a metallic material such as copper, gold, nickel, and the like, and combinations thereof.

In one aspect, the lead—solder interface 208 and/or the lead—solder interface 308 may include solder and/or be formed from solder. The solder may be any fusible metal alloy that may be used to form a bond between the lower surface 114 and the pad 202 and the lower surface 124 and the pad 302. The solder may be a lead-free solder, a lead solder, or the like. The lead-free solder may contain tin, copper, silver, bismuth, indium, zinc, antimony, traces of other metals, and/or the like. The lead solder may contain lead, other metals such as tin, and/or the like. The solder may further include flux as needed.

Figure 5:
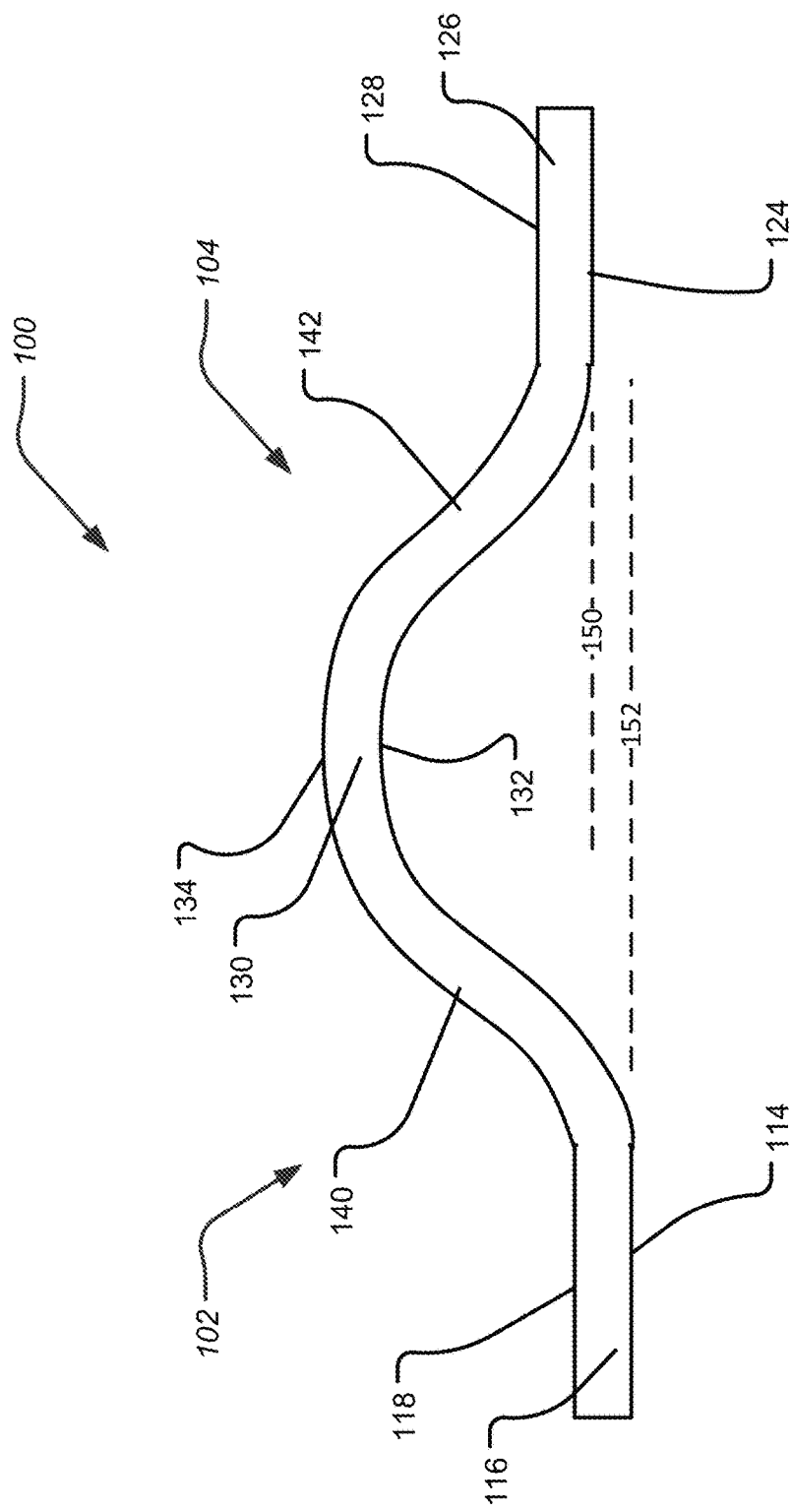
FIG. 5 illustrates a side view of the system according to FIG. 4.

FIG. 5 illustrates a side view of the system according to FIG. 4.

In particular, FIG. 5 further illustrates details of the lead 102. In this regard, although FIG. 5 illustrates a particular shape of the lead 102, the various other shapes of the lead 102 as described herein may also likewise include the various details of the lead 102 as further described herein.

The lead 102 may include a pad connection portion 116. The pad connection portion 116 may include the lower surface 114 arranged on the lower surface thereof. The pad connection portion 116 may further include an upper surface 118.

In one aspect, the pad connection portion 116 may be generally flat. In one aspect, the upper surface 118 may be generally parallel to the plane 152. In one aspect, the lower surface 114 may be within and generally parallel to the plane 152.

The lead 102 may include a pad connection portion 126. The pad connection portion 126 may include the lower surface 124 arranged on the lower surface thereof. The pad connection portion 126 may further include an upper surface 128.

In one aspect, the pad connection portion 126 may be generally flat. In one aspect, the upper surface 128 may be generally flat. In one aspect, the upper surface 128 may be generally parallel to the plane 150. In one aspect, the lower surface 124 may be generally flat. In one aspect, the lower surface 124 may be generally parallel to and within the plane 150.

In one aspect, the plane 152 and the plane 150 may be vertically offset as illustrated in FIG. 5. In one aspect, the plane 152 and the plane 150 may be vertically at the same vertical height (not shown).

The lead 102 may include an upper portion 130. The upper portion 130 may include a lower surface 132 arranged on a lower surface thereof. The upper portion 130 may include an upper surface 134 arranged on the upper surface thereof. In one aspect, the upper portion 130 may be arranged between the pad connection portion 116 and the pad connection portion 126.

The lead 102 may include a connection portion 140 that connects between the pad connection portion 116 and the upper portion 130. The connection portion 140 may have an upper surface and a lower surface. In one aspect, the connection portion 140 may curve upwardly from the plane 152 from the pad connection portion 116 to connect to the upper portion 130.

The lead 102 may include a connection portion 142 that connects between the pad connection portion 126 and the upper portion 130. The connection portion 142 may have an upper surface and a lower surface. In one aspect, the connection portion 142 may curve upwardly from the plane 150 from the pad connection portion 126 to connect to the upper portion 130.

In one aspect, the upper portion 130 may have a curved construction as illustrated in FIG. 1 and FIG. 5. In one aspect, the upper portion 130 may have a curved construction extending between the connection portion 140 and the connection portion 142 as illustrated in FIG. 1 and FIG. 5. In one aspect, the upper portion 130 may have a curved convex construction as illustrated in FIG. 1 and FIG. 5.

In one aspect, the upper portion 130 may have a curved triangular-shaped construction as illustrated in FIG. 2. In one aspect, the upper portion 130 may have a curved triangular-shaped construction extending between the connection portion 140 and the connection portion 142 as illustrated in FIG. 2. In one aspect, the upper portion 130 may have a curved convex construction as illustrated in FIG. 2.

In one aspect, the upper portion 130 may have a bow-shaped construction as illustrated in FIG. 3. In one aspect, the upper portion 130 may have a curved bow-shaped construction extending between the connection portion 140 and the connection portion 142 as illustrated in FIG. 3. In one aspect, the upper portion 130 may have a curved convex construction as illustrated in FIG. 3.

In one aspect, the connection portion 140 may have a curved construction. In one aspect, the connection portion 140 may have a curved construction extending between the pad connection portion 116 and the upper portion 130. In one aspect, the connection portion 140 may have a concave curved construction. In one aspect, the connection portion 140 may have a concave curved construction extending between the pad connection portion 116 and the upper portion 130.

In one aspect, the connection portion 142 may have a curved construction. In one aspect, the connection portion 142 may have a curved construction extending between the pad connection portion 126 and the upper portion 130. In one aspect, the connection portion 142 may have a concave curved construction. In one aspect, the connection portion 142 may have a concave curved construction extending between the pad connection portion 116 and the upper portion 130.

In one aspect, the lower surface 132 may be arranged vertically above the lower surface 114 with respect to the plane 152. In one aspect, the lower surface 132 may be arranged vertically above the lower surface 124 with respect to the plane 150.

In one aspect, the lower surface 132 may be arranged vertically above the lower surface 114 with respect to the plane 152 and the lower surface 132 may be arranged vertically above the lower surface 124 with respect to the plane 150.

In one aspect, the lower surface 132 may be arranged vertically above the upper surface 118 with respect to the plane 152. In one aspect, the lower surface 132 may be arranged vertically above the upper surface 128 with respect to the plane 150. In one aspect, the lower surface 132 may be arranged vertically above the upper surface 118 with respect to the plane 152 and the lower surface 132 may be arranged vertically above the upper surface 128 with respect to the plane 150.

In one aspect, portions of the connection portion 140 may be arranged vertically above the lower surface 114 with respect to the plane 152. In one aspect, portions of the connection portion 142 may be arranged vertically above the lower surface 124 with respect to the plane 150. In one aspect, portions of the connection portion 140 may be arranged vertically above the lower surface 114 with respect to the plane 152 and portions of the connection portion 142 may be arranged vertically above the lower surface 124 with respect to the plane 150.

In one aspect, portions of the connection portion 140 may be arranged vertically above the upper surface 118 with respect to the plane 152. In one aspect, portions of the connection portion 142 may be arranged vertically above the upper surface 128 with respect to the plane 150. In one aspect, portions of the connection portion 140 may be arranged vertically above the upper surface 118 with respect to the plane 152 and portions of the connection portion 142 may be arranged vertically above the upper surface 128 with respect to the plane 150.

Figure 6:
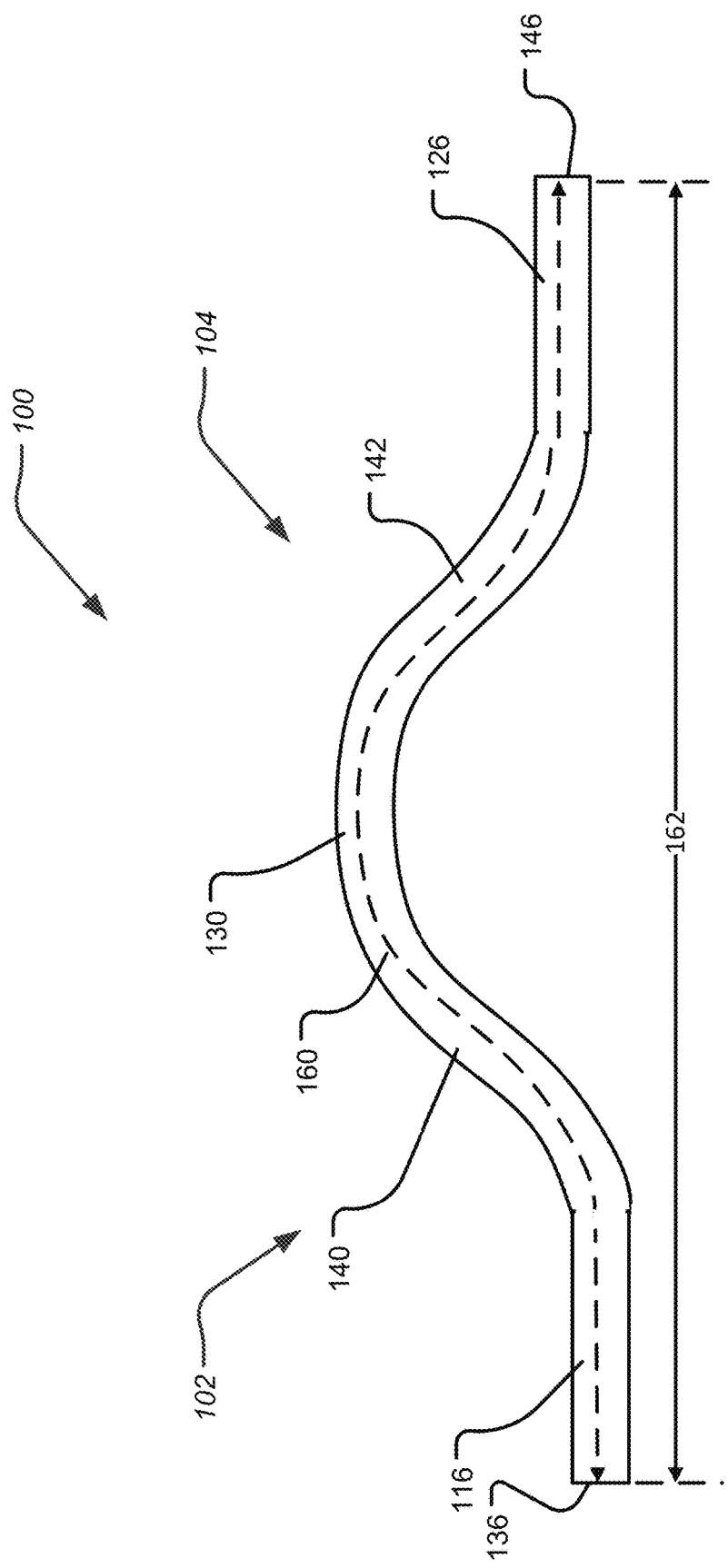
FIG. 6 illustrates a side view of the system according to FIG. 4.

FIG. 6 illustrates a side view of the system according to FIG. 4.

In particular, FIG. 6 further illustrates details of the lead 102. In this regard, although FIG. 6 illustrates a particular shape of the lead 102, the various other shapes of the lead 102 as described herein may also likewise include the various details of the lead 102 as further described herein.

As illustrated in FIG. 6, the lead 102 may include a first end portion 136 and a second end portion 146. In one aspect, the first end portion 136 may form a terminating end of the lead 102 (left end of the lead 102); and the second end portion 146 may form a terminating end of the lead 102 (right end of the lead 102). A linear distance 162 from the first end portion 136 to the second end portion 146 is illustrated in FIG. 6. In other words, the linear distance 162 from the first end portion 136 to the second end portion 146 may be the dimensional linear distance from the first end portion 136 to the second end portion 146.

A curved distance 160 from the first end portion 136 to the second end portion 146 is also illustrated in FIG. 6. The curved distance 160 includes a length of the pad connection portion 116, a length of the connection portion 140, a length of the upper portion 130, a length of the connection portion 142, and a length of the pad connection portion 126. In other words, the curved distance 160 may be the length of the lead 102 if it was flattened.

In one aspect, the curved distance 160 of the lead 102 is greater than the linear distance 162. In one aspect, the curved distance 160 of the lead 102 is 5% to 50% greater, 5% to 10% greater, 10% to 15% greater, 15% to 20% greater, 20% to 25% greater, 25% to 30% greater, 30% to 40% greater, 40% to 50% greater than the linear distance 162.

Figure 7:
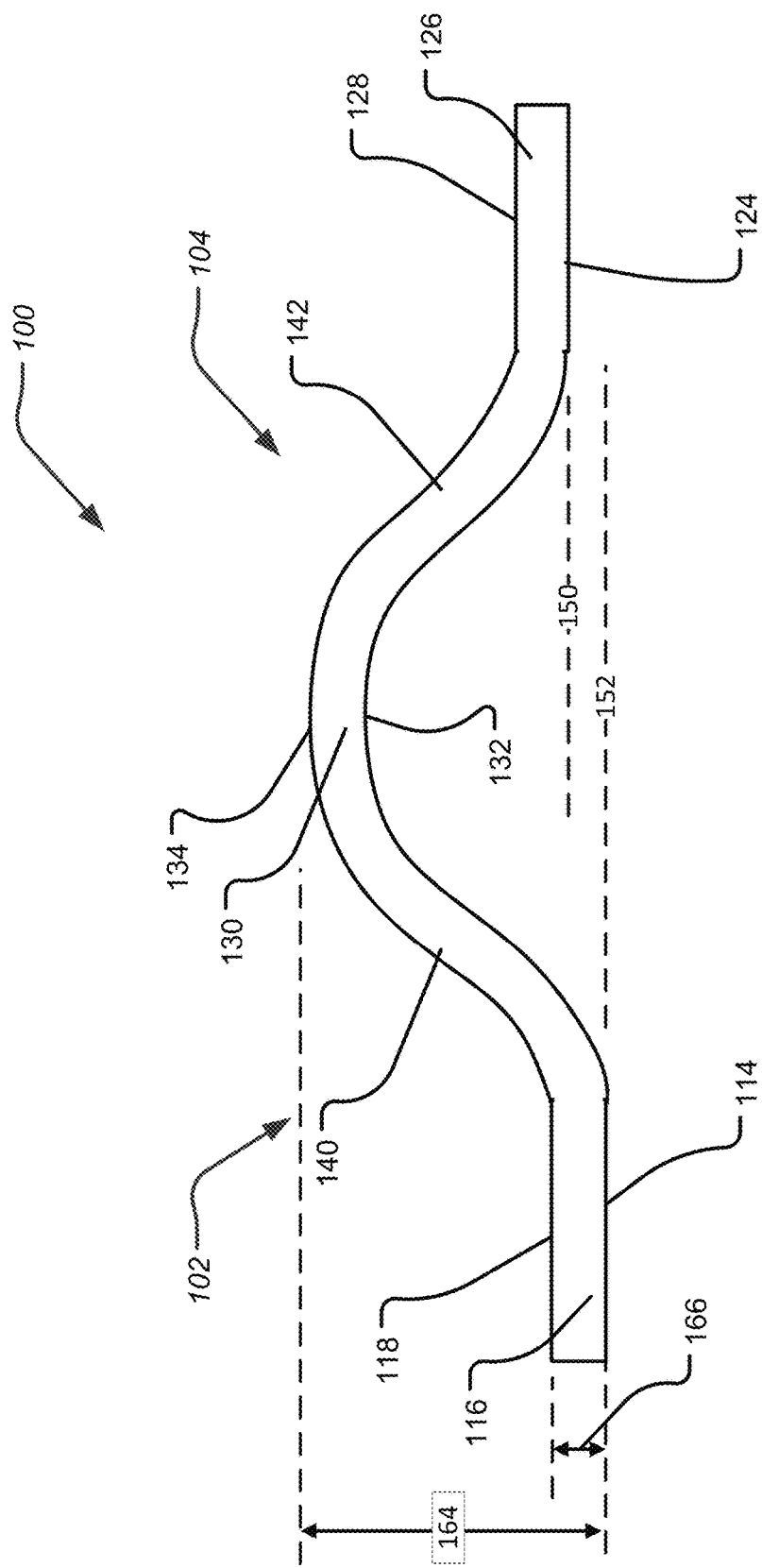
FIG. 7 illustrates a side view of the system according to FIG. 4.

FIG. 7 illustrates a side view of the system according to FIG. 4.

In particular, FIG. 7 further illustrates details of the lead 102. In this regard, although FIG. 7 illustrates a particular shape of the lead 102, the various other shapes of the lead 102 as described herein may also likewise include the various details of the lead 102 as further described herein.

FIG. 7 further illustrates a vertical height 166 or thickness of the pad connection portion 116. In one aspect, the vertical height 166 of the pad connection portion 116 may be defined as a distance from the plane 152 and/or the lower surface 114 to the upper surface 118 as illustrated in FIG. 7.

FIG. 7 further illustrates a vertical height 164 of the upper surface 134 of the upper portion 130. In one aspect, the vertical height 164 of the upper portion 130 may be defined as a distance from the plane 152 and/or the lower surface 114 to the upper surface 134 as illustrated in FIG. 7.

In one aspect, the vertical height 164 of the upper surface 134 of the upper portion 130 may be greater than the vertical height 166 of the pad connection portion 116.

In one aspect, the vertical height 164 of the upper portion 130 may be 2 to 20 times greater, 2 to 4 times greater, 4 to 6 times greater, 6 to 8 times greater, 8 to 10 times greater, 10 to 12 times greater, 12 to 14 times greater, 14 to 16 times greater, 16 to 18 times greater, or 18 to 20 times greater than the vertical height 166 of the pad connection portion 116.

In one aspect, the vertical height 164 of the upper portion 130 may be 2 to 20 times greater, 2 to 4 times greater, 4 to 6 times greater, 6 to 8 times greater, 8 to 10 times greater, 10 to 12 times greater, 12 to 14 times greater, 14 to 16 times greater, 16 to 18 times greater, or 18 to 20 times greater than the vertical height of the pad connection portion 126.

In particular, the one or more aspects of the construction of the lead 102 described herein may allow the lead 102 and/or the stress relief feature 106 to flex during changes in temperature that may be associated with movement of the various components of the device 500 that may experience thermal excursion, thermal expansion, temperature changes, and/or the like reducing stress in the lead—solder interface 208 and/or the lead—solder interface 308.

Figure 8:
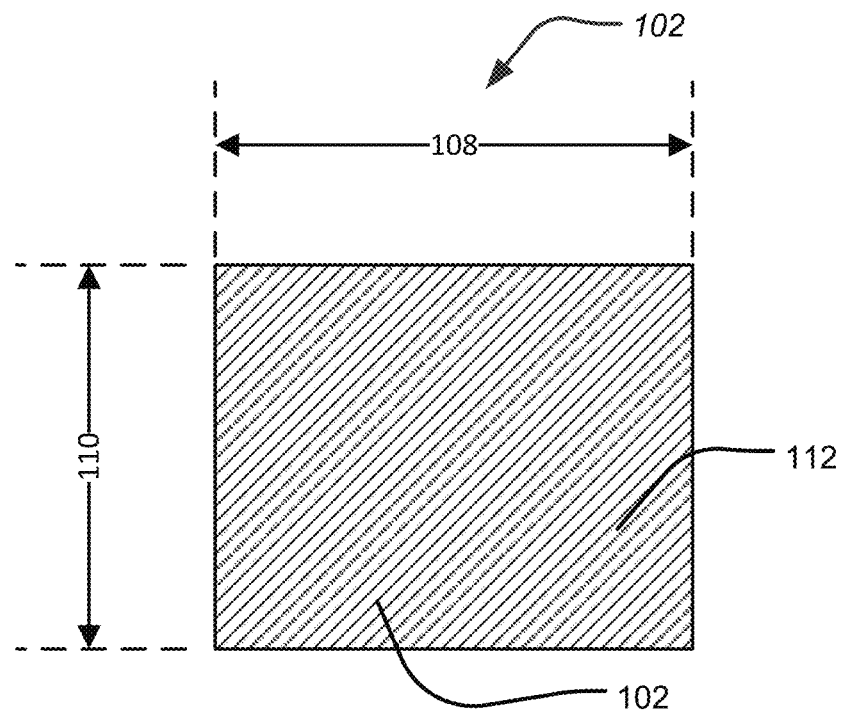
FIG. 8 illustrates a cross-sectional view of the lead of FIG. 4 along the lines V-V according to aspects of the disclosure.

FIG. 8 illustrates a cross-sectional view of the lead of FIG. 4 along the lines V-V according to aspects of the disclosure.

In particular, FIG. 8 illustrates a cross-sectional view of the lead 102 that forms the at least one connection 104. The lead 102 may have a smaller and/or thinner construction in comparison to prior art leads and may further provide the functionality of the system 100 to increase reliability of the at least one connection 104 increase reliability of the lead—solder interface 208, and/or increase reliability of the lead—solder interface 308. As shown in FIG. 8, the lead 102 may have a generally rectangular cross-sectional shape as illustrated in FIG. 8, a generally square (not shown), and/or the like. In this regard, the lead 102 may have a width 108, a height 110, and an area 112. One or more of the width 108, the height 110, and the area 112 may be less than prior art leads in order to further provide the functionality of the system 100 to increase reliability of the at least one connection 104, increase reliability of the lead—solder interface 208, and/or increase reliability of the lead—solder interface 308. In particular, the smaller and/or thinner construction of the lead 102 may allow the lead 102 and/or the stress relief feature 106 to flex during changes in temperature that may be associated with movement of the various components of the device 500 that may experience thermal excursion, thermal expansion, temperature changes, and/or the like reducing stress in the lead—solder interface 208 and/or the lead—solder interface 308.

In one aspect, the lead 102 may have a smaller and/or thinner construction along the entire length thereof.

In one aspect, the lead 102 may have a smaller and/or thinner construction along a portion of the entire length thereof.

In one aspect, the lead 102 may have a smaller and/or thinner construction in one of the pad connection portion 116, the connection portion 140, the upper portion 130, the connection portion 142, and/or the pad connection portion 126.

In one aspect, the width 108 may be 5% to 50% less, 5% to 10% less, 10% to 15% less, 15% to 20% less, 20% to 30% less, 30% to 40% less, or 40% to 50% less than a width of a prior art lead.

In one aspect, the height 110 may be 5% to 50% less, 5% to 10% less, 10% to 15% less, 15% to 20% less, 20% to 30% less, 30% to 40% less, or 40% to 50% less than a height of a prior art lead.

In one aspect, the area 112 may be 5% to 50% less, 5% to 10% less, 10% to 15% less, 15% to 20% less, 20% to 30% less, 30% to 40% less, or 40% to 50% less than an area of a prior art lead.

Figure 9:
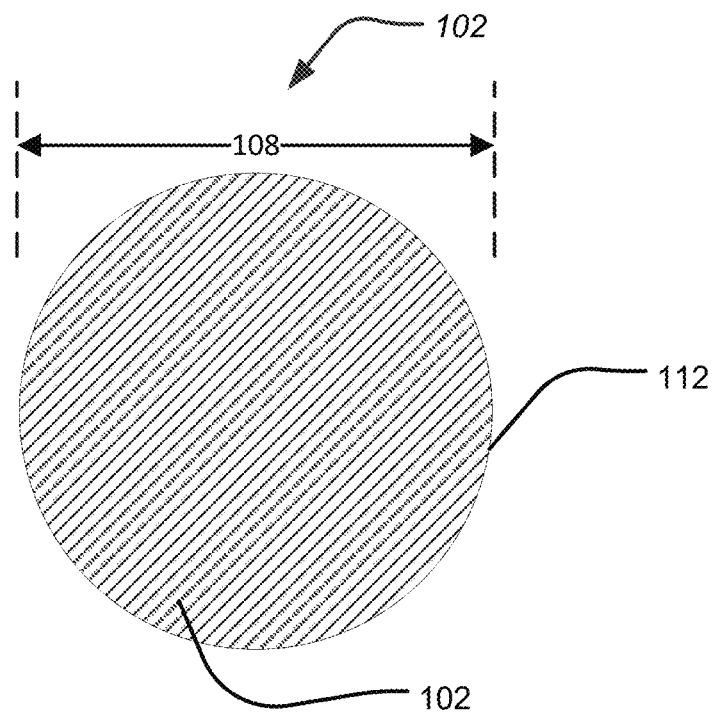
FIG. 9 illustrates a cross-sectional view of the lead of FIG. 4 along the lines V-V according to aspects of the disclosure.

FIG. 9 illustrates a cross-sectional view of the lead of FIG. 4 along the lines V-V according to aspects of the disclosure.

In particular, FIG. 9 illustrates a cross-sectional view of the lead 102 that forms the at least one connection 104. The lead 102 may have a smaller and/or thinner construction in comparison to prior art leads in order to further provide the functionality of the system 100 to increase reliability of the at least one connection 104, increase reliability of the lead—solder interface 208, and/or increase reliability of the lead—solder interface 308. As shown in FIG. 9, the lead 102 may have a generally circular cross-sectional shape as illustrated in FIG. 9 or a generally oval cross-sectional shape (not shown). In this regard, the lead 102 may have a width 108 (or diameter) and an area 112. One or more of the width 108 and the area 112 may be less than prior art leads in order to further provide the functionality of the system 100 to increase reliability of the at least one connection 104, increase reliability of the lead—solder interface 208, and/or increase reliability of the lead—solder interface 308. In particular, the smaller and/or thinner construction of the lead 102 may allow the lead 102 and/or the stress relief feature 106 to flex during changes in temperature that may be associated with movement of the various components of the device 500 that may experience thermal excursion, thermal expansion, temperature changes, and/or the like reducing stress in the lead—solder interface 208 and/or the lead—solder interface 308.

In one aspect, the lead 102 may have a smaller and/or thinner construction along the entire length thereof.

In one aspect, the lead 102 may have a smaller and/or thinner construction along a portion of the entire length thereof.

In one aspect, the lead 102 may have a smaller and/or thinner construction in one of the pad connection portion 116, the connection portion 140, the upper portion 130, the connection portion 142, and/or the pad connection portion 126.

In one aspect, the width 108 may be 5% to 50% less, 5% to 10% less, 10% to 15% less, 15% to 20% less, 20% to 30% less, 30% to 40% less, or 40% to 50% less than a width of a prior art lead.

In one aspect, the area 112 may be 5% to 50% less, 5% to 10% less, 10% to 15% less, 15% to 20% less, 20% to 30% less, 30% to 40% less, or 40% to 50% less than an area of a prior art lead.

The lead 102 may be formed with a forming tool. In one aspect, the forming tool may be a die. In one aspect, the forming tool may cut or shape the lead 102 using a press. The forming tool may include any one or more of a die block, a punch plate, a blank punch, a pierce punch, a stripper plate, a pilot, a guide, a back gauge, or finger stop, a setting block, blanking die, a pierce die, a shank, and/or the like.

In aspects, the stress relief feature 106 may include one or more of the lead 102, the smaller and/or thinner construction of the lead 102, the pad connection portion 116, the connection portion 140, the upper portion 130, the connection portion 142, the pad connection portion 126 and/or the like as disclosed herein.

In aspects, the lead 102 and/or the stress relief feature 106 may be configured to flex during changes in temperature that may be associated with movement of the various components of the device 500 that may experience thermal excursion, thermal expansion, temperature changes, and/or the like.

In aspects, the lead 102 and/or the stress relief feature 106 may be configured to reduce the stress in the lead—solder interface 208 and the lead—solder interface 308. In aspects, the lead 102 and/or the stress relief feature 106 may be configured to reduce the stress in the lead—solder interface 208 and the lead—solder interface 308 during thermal excursions.

In aspects, the lead 102 and/or the stress relief feature 106 may be configured to reduce solder fatigue in the lead—solder interface 208 and the lead—soder interface 308. In aspects, the lead 102 and/or the stress relief feature 106 may be configured to reduce solder fatigue in the lead—solder interface 208 and the lead—solder interface 308 during thermal excursions.

In aspects, the lead 102 and/or the stress relief feature 106 may be configured to reduce defects in the lead—solder interface 208 and the lead—solder interface 308. In aspects, the lead 102 and/or the stress relief feature 106 may be configured to reduce defects in the lead—solder interface 208 and the lead—solder interface 308 during thermal excursions. The defects may include cracks, fatigue features, fractures, delamination, and/or the like.

Additionally, the system 100 implementing the lead 102 and/or the stress relief feature 106 reduces failure modes and defects such as cracks, fatigue features, fractures, delamination, and/or the like in the connection between one or more of the lead 102, the lead—solder interface 208, the lead—solder interface 308, the pad 202, the pad 302, and the like.

Moreover, the system 100 implementing the lead 102 and/or the stress relief feature 106 ensures a greater number of the devices 500 passing thermal shock tests, temperature cycle tests, and/or the like.

In one or more aspects, the at least one support structure 200 may be configured to mechanically support and electrically connect the at least one electrical component 300 and other electronic components. In one or more aspects, the at least one support structure 200 may include conductive tracks, pads, the pad 202, and other features. In one or more aspects, the at least one support structure 200 may be etched from one or more sheet layers of metallic materials, such as copper, that may be laminated onto and/or between sheet layers of a non-conductive substrate materials. The at least one electrical component 300 and the other electronic components may be generally soldered onto the at least one support structure 200 to both electrically connect and mechanically fasten the at least one electrical component 300 and other electronic components to the at least one support structure 200 with at least one of the lead 102 as disclosed herein.

The at least one support structure 200 may be single-sided (one metallic layer), double-sided (two metallic layers on both sides of one substrate layer), or multi-layer (outer and inner layers of copper, alternating with layers of substrate). The at least one support structure 200 may include separate conducting lines, tracks, circuit traces, pads for connections, vias to pass connections between layers of copper, and features such as solid conductive areas for EM shielding or other purposes.

The at least one support structure 200 may include conductors on different layers that may be connected with vias, which may be metallic plated holes, such as copper-plated holes, that may function as electrical tunnels through the insulating substrate. The at least one support structure 200 may include "Through hole" components that may be mounted by their wire leads passing through the at least one support structure 200 and soldered to traces on the other side. The at least one support structure 200 may include "Surface mount" components that may be attached by their leads, including at least one of the lead 102 as disclosed herein, to copper traces on the same side of the at least one support structure 200.

In one aspect, the at least one support structure 200 may be a co-planar wave-guide (CPWG) that may be fabricated using printed circuit board technology. In this aspect, the at least one support structure 200 may include a conducting track printed onto a dielectric substrate, together with one or more return conductors, at least one to either side of the track. In this regard, the conductors may be on a same side of the substrate, and hence may be coplanar.

The at least one support structure 200 may be manufactured utilizing one or more manufacturing techniques including silk screen printing processes, photoengraving processes, print onto transparent film processes, photo mask processes, photo-sensitized board processes, laser resist ablation processes, milling processes, laser etching processes, and/or like processes. In one or more aspects, the at least one support structure 200 may be a printed circuit board (PCB).

The at least one electrical component 300 may include any electrical component for any application. In one aspect, the at least one electrical component 300 may be an RF (Radio Frequency) component. In one aspect, the at least one electrical component 300 may be a silicon-carbide Schottky diode, a MOSFET (metal-oxide-semiconductor field-effect transistor), a power module, a gate driver, and the like. In one aspect, the at least one electrical component 300 may be an RF (Radio Frequency) component such as a General-Purpose Broadband component, a Telecom component, a L-Band component, a S-Band component, a X-Band component, a C-Band component, a Ku-Band component, a Satellite Communications component, and the like.

In one aspect, the at least one electrical component 300 may be a high-electron mobility transistor (HEMT). In this regard, the HEMT may be Group III-Nitride based devices and such HEMTs are very promising candidates for high power Radio Frequency (RF) applications, for low frequency high power switching applications, as well as other applications. For example, the material properties of Group III-nitrides, such as GaN and its alloys, enable achievement of high voltage and high current, along with high RF gain and linearity for RF applications. A typical Group III-nitride HEMT relies on the formation of a two-dimensional electron gas (2DEG) at the interface between a higher band gap Group-III nitride (e.g., AlGaN) barrier layer and a lower band gap Group-III nitride material (e.g., GaN) buffer layer, where the smaller band gap material has a higher electron affinity. The 2DEG is an accumulation layer in the smaller band gap material and can contain a high electron concentration and high electron mobility.

Figure 10:
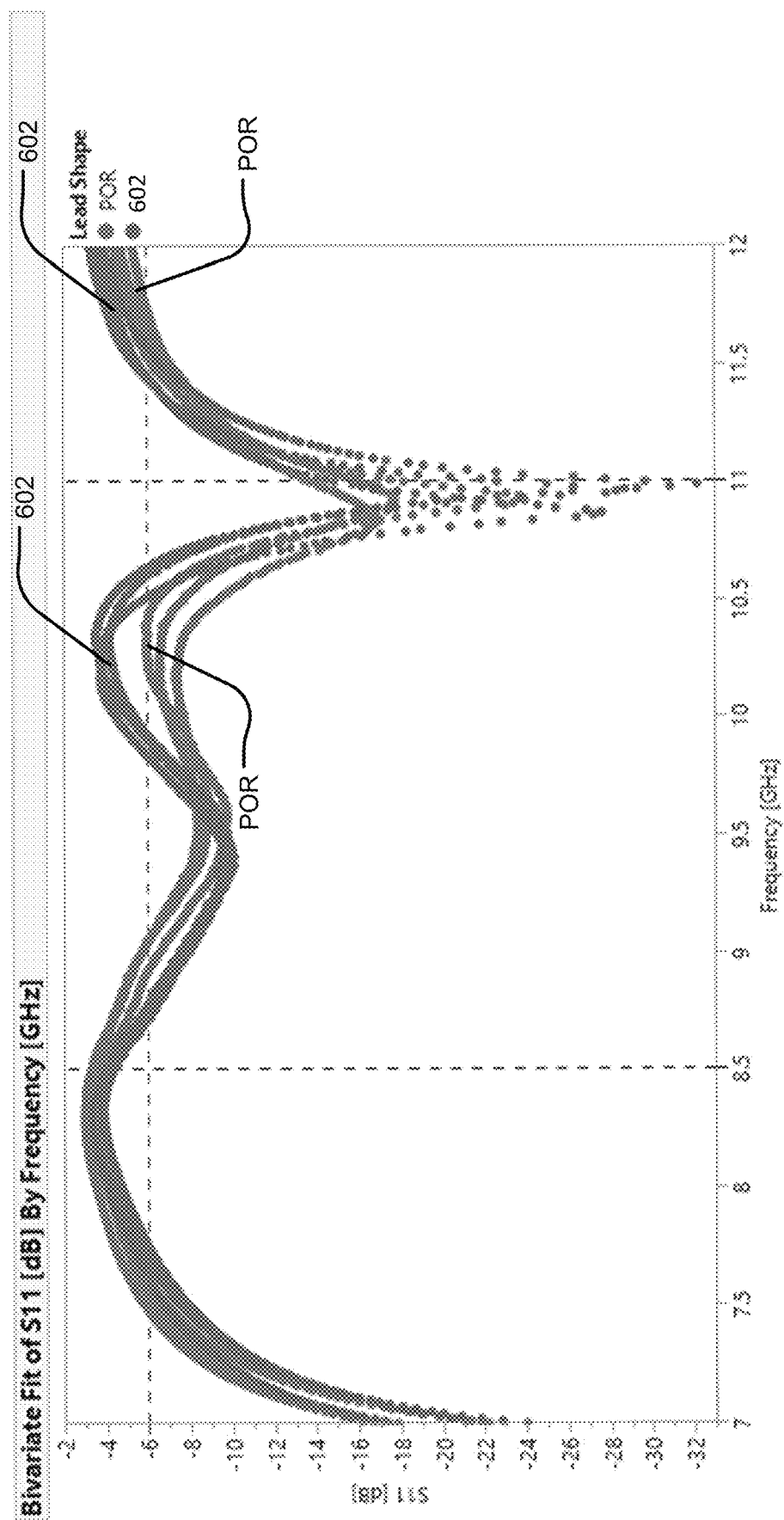
FIG. 10 illustrates a graph showing possible degraded signaling performance in some implementations.

FIG. 10 illustrates a graph showing possible degraded signaling performance in some implementations.

In particular, FIG. 10 illustrates a possible degraded signaling performance based on a bivariate fit of S11 (dB) by frequency (GHz). In particular implementations, the system 100 utilizing the lead 102 implementing a non-flat construction as described by the disclosure may in some implementations degrade signaling performance between the at least one support structure 200 and the at least one electrical component 300.

In one aspect, the RF performance may be defined by scattering parameters or S-parameters that may describe an electrical behavior of the device 500. The S-parameters may include gain, return loss, voltage standing wave ratio (VSWR), reflection coefficient, and/or the like.

For example, the system 100 utilizing the lead 102 as described by the disclosure may in some implementations degrade signaling performance between the at least one support structure 200 and the at least one electrical component 300 when the at least one electrical component 300 is implemented as a radiofrequency device. In this regard, the at least one electrical component 300 configured a radiofrequency device may be required to maintain a high radiofrequency (RF) performance at a required frequency range. For example, the RF performance directed to input return loss (S11) may be higher in some aspects utilizing the system 100 having the lead 102. In this regard, FIG. 10 illustrates that the POR (point of reference) bivariate fit of S11 (dB) by frequency (GHz) implementing a prior art flat lead may have lower S11 values (better) in comparison to the S11 values for the system 100 (for example in the frequency range of 10-10.5 GHz for some implementations). In other words, the system 100 may experience signaling degradation realized by the lead 102 and/or the stress relief feature 106 of the system 100.

Figure 11:
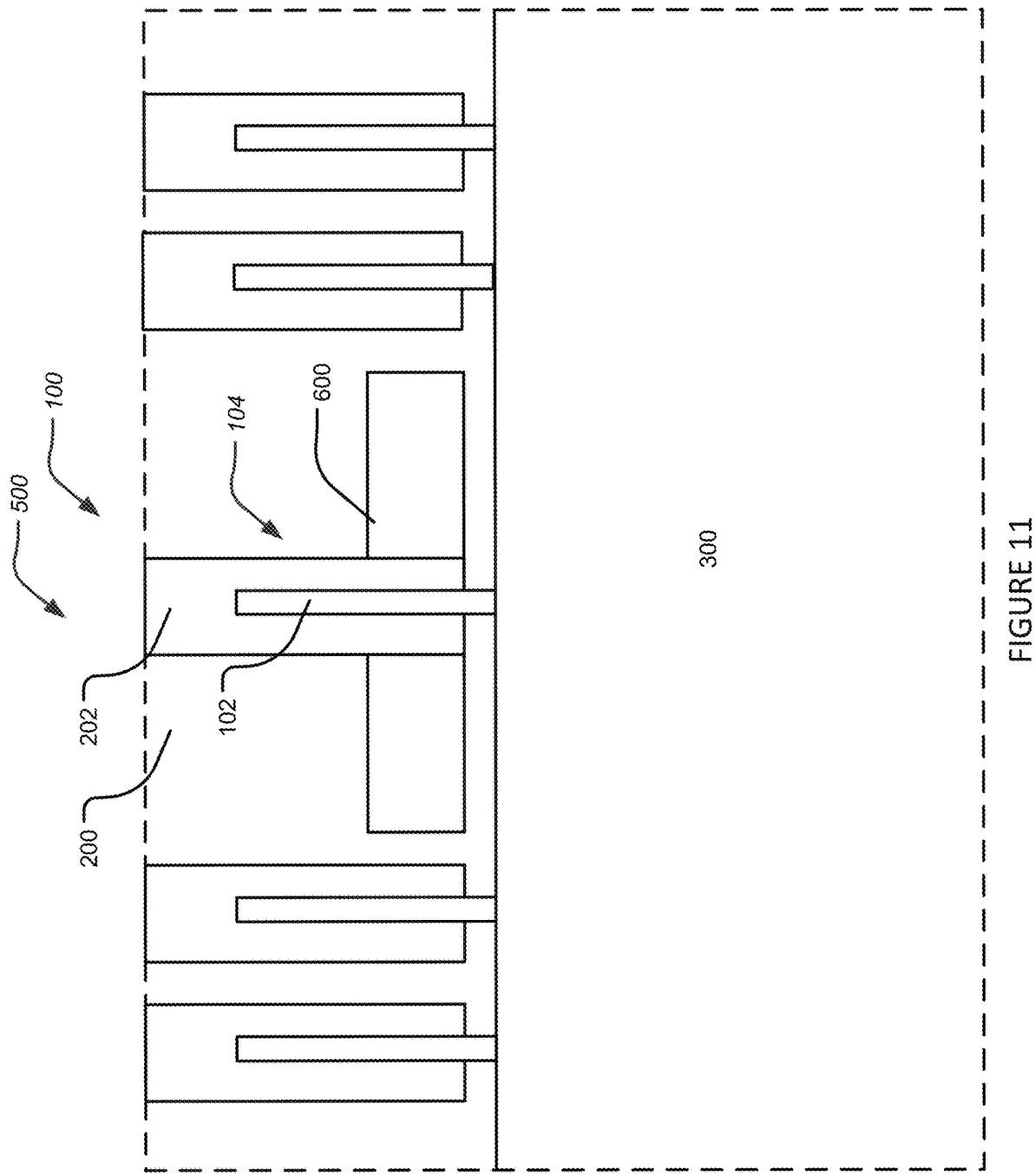
FIG. 11 illustrates a top view of a system according to aspects of the disclosure.

FIG. 11 illustrates a top view of a system according to aspects of the disclosure.

Figure 12:
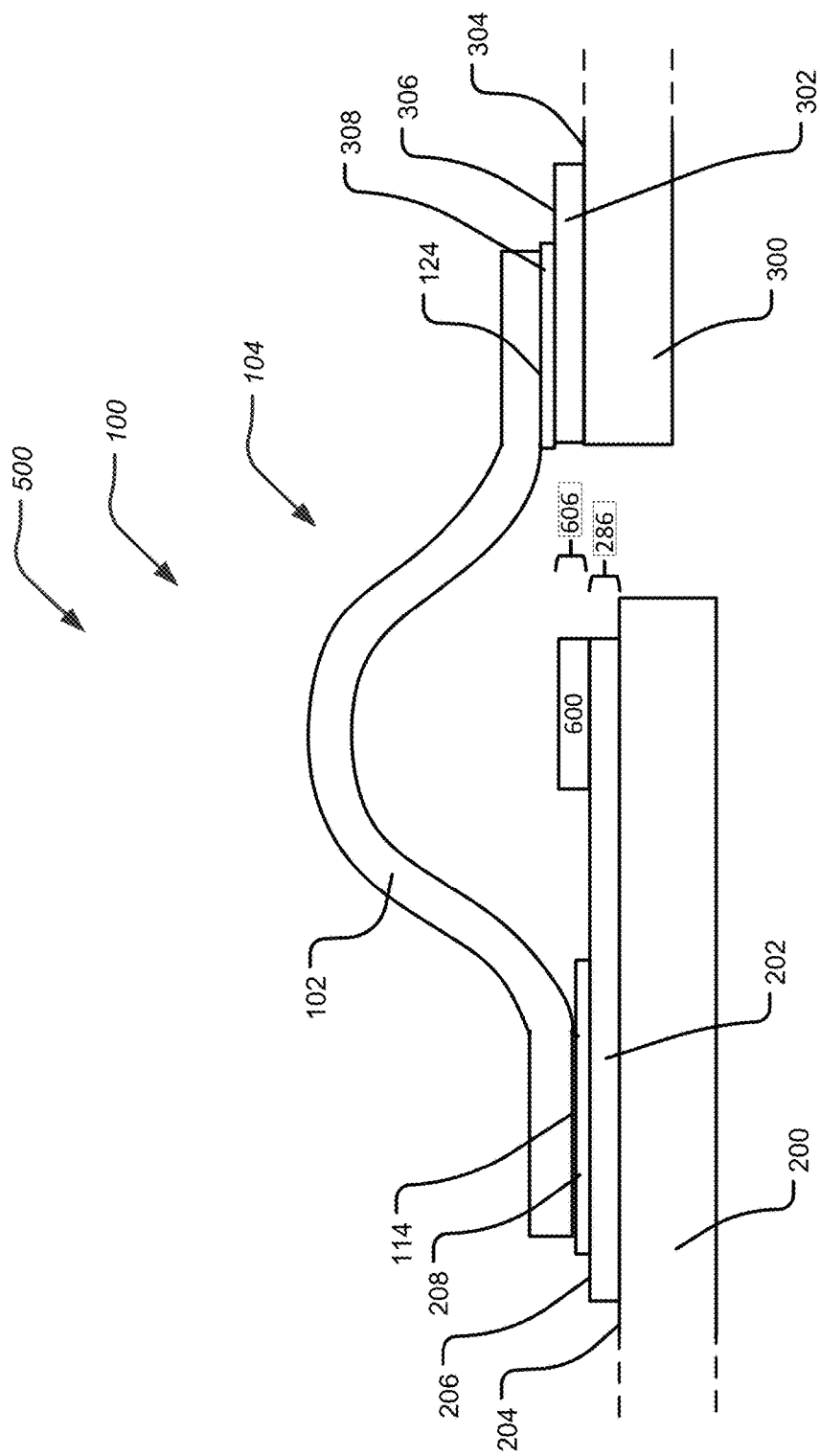
FIG. 12 illustrates a side view of the system according FIG. 11.

FIG. 12 illustrates a side view of the system according FIG. 11.

Figure 13:
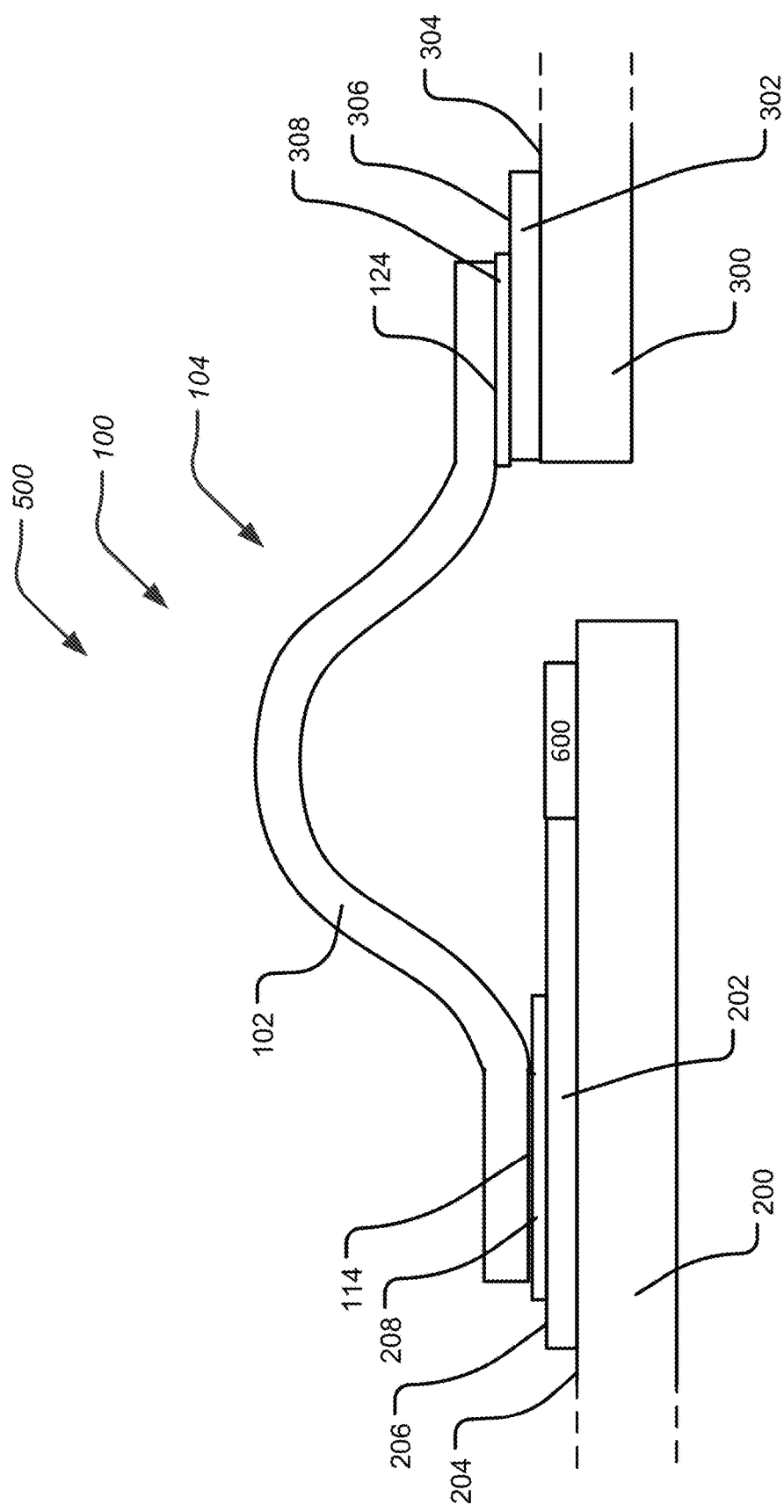
FIG. 13 illustrates a side view of the system according FIG. 11.

FIG. 13 illustrates a side view of the system according FIG. 11.

Figure 14:
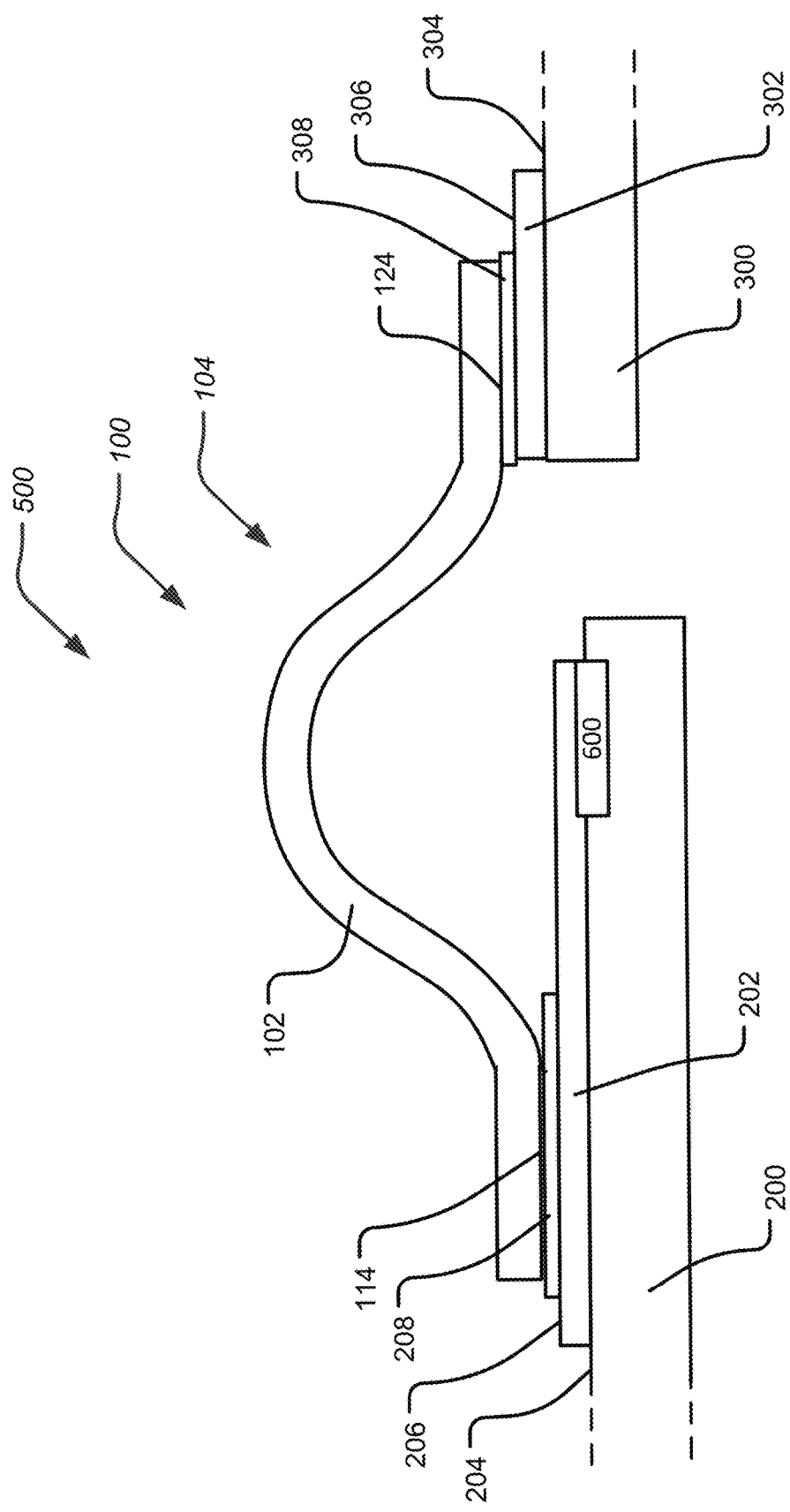
FIG. 14 illustrates a side view of the system according FIG. 11.

FIG. 14 illustrates a side view of the system according FIG. 11.

Figure 15:
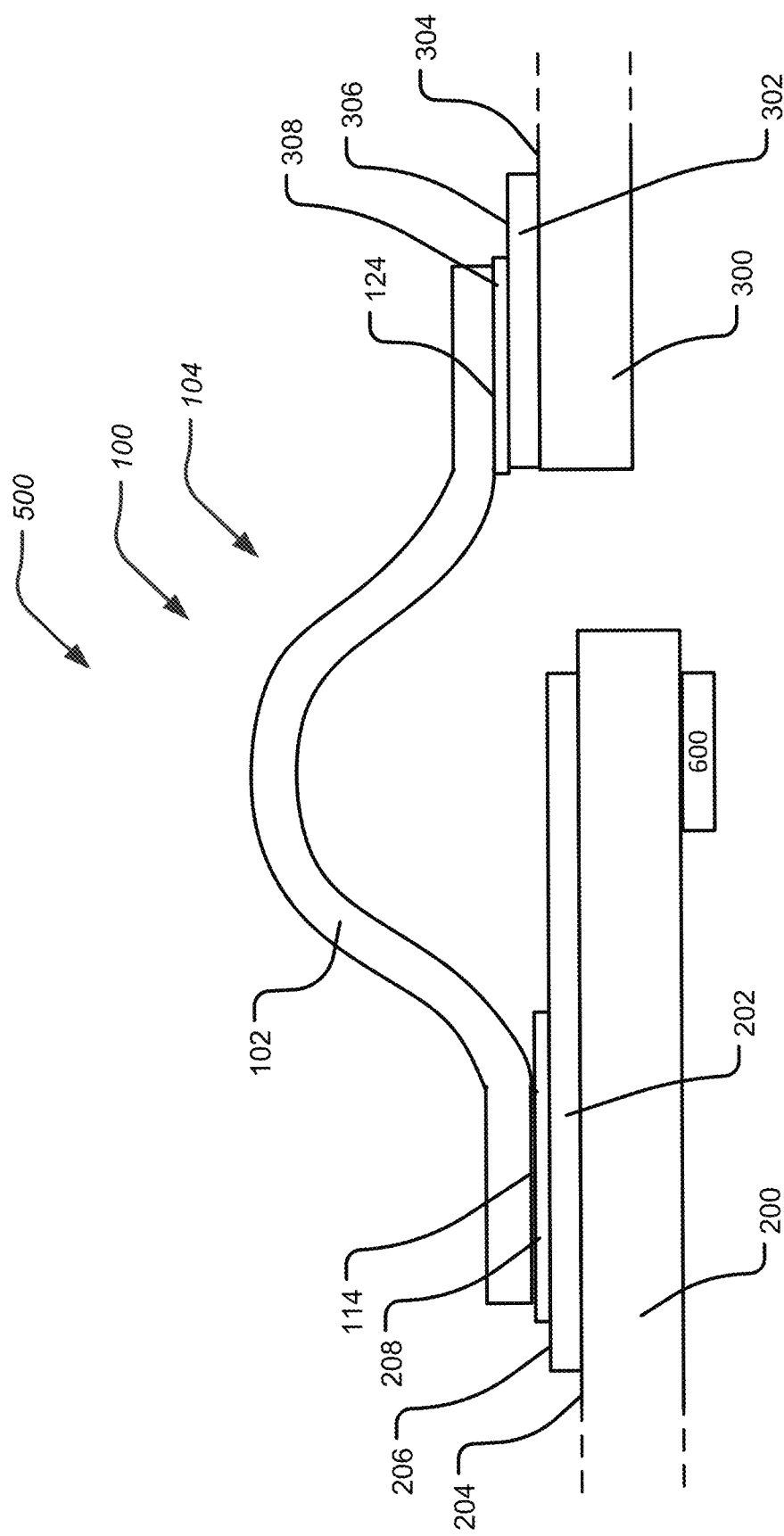
FIG. 15 illustrates a side view of the system according to FIG. 11.

FIG. 15 illustrates a side view of the system according to FIG. 11.

In particular, FIG. 11 illustrates an element 600 implemented by the system 100. The element 600 may be configured to alleviate signaling degradation realized by the lead 102 and/or the stress relief feature 106 of the system 100. In one aspect, the element 600 may be implemented with a metallic portion, a metallic component, a metallic pad, and/or the like (hereinafter metallic pad for brevity) arranged under the stress relief feature 106 and/or the lead 102. In one aspect, the element 600 may be implemented with a metallic pad that is electrically connected to the pad 202. In one aspect, the element 600 may be implemented with a metallic pad that is electrically isolated from the pad 202. In one aspect, the element 600 may add a shunt capacitance, which counteracts an additional parasitic inductance caused by the lead 102 and/or the stress relief feature 106.

As illustrated in FIG. 12, the element 600 may be implemented with a metallic pad that is on the pad 202. In one aspect, the element 600 may be implemented with a metallic pad that is on the at least one support structure 200. In one aspect, the element 600 may be implemented with a metallic pad that is partially directly on the at least one support structure 200.

As illustrated in FIG. 13, the element 600 may be implemented with a metallic pad that is adjacent the pad 202. In one aspect, the element 600 may be implemented with a metallic pad that is on the at least one support structure 200. In one aspect, the element 600 may be implemented with a metallic pad that is directly on the at least one support structure 200.

As illustrated in FIG. 14, the element 600 may be implemented with a metallic pad that is at least partially below the pad 202. In one aspect, the element 600 may be implemented with a metallic pad that is on the at least one support structure 200. In one aspect, the element 600 may be implemented with a metallic pad that is directly on the at least one support structure 200. In one aspect, the element 600 may be implemented with a metallic pad that is partially within the at least one support structure 200.

As illustrated in FIG. 15, the element 600 may be implemented with a metallic pad that is below the pad 202. In one aspect, the element 600 may be implemented with a metallic pad that is on a lower side of the at least one support structure 200. In one aspect, the element 600 may be implemented with a metallic pad that is directly on a lower side of the at least one support structure 200. In one aspect, the element 600 may have a rectangular shape. In other aspects, the element 600 may have a polygonal shape, a freeform shape, a circular shape, or the like.

Figure 16:
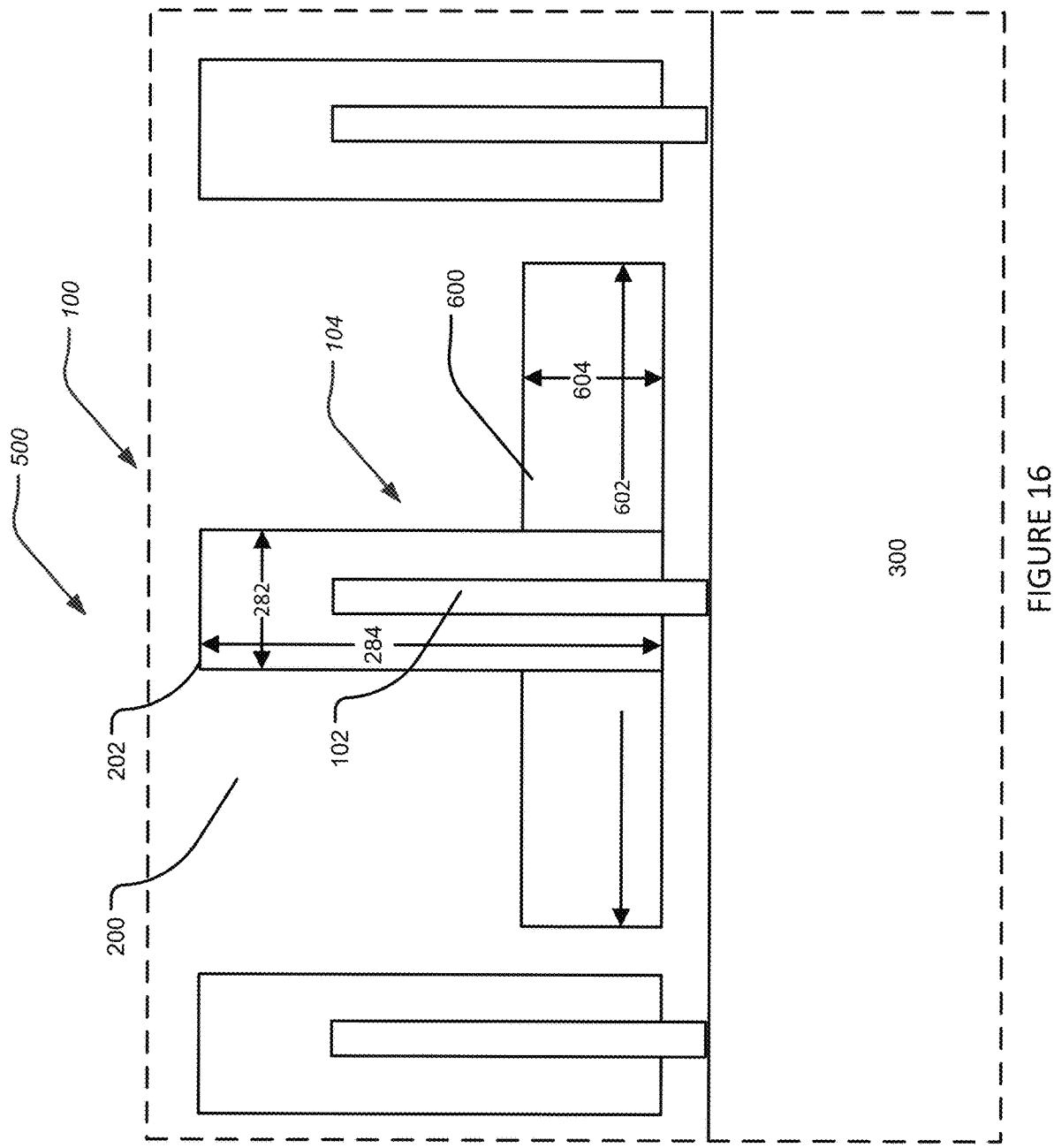
FIG. 16 illustrates a top view of the system according to FIG. 11.

FIG. 16 illustrates a top view of the system according to FIG. 11.

In particular, FIG. 16 illustrates various exemplary dimensions of the element 600. In particular, the element 600 may include a length 602, a width 604, and a thickness 606 (see FIG. 12). The pad 202 may include a length 282, a width 284, and a thickness 286 (see FIG. 12).

In one aspect, the length 602 of the element 600 is greater than the length 282 of the at least one support structure 200. In one aspect, the length 602 of the element 600 is 100% to 1000%, 100% to 200%, 200% to 300%, 300% to 400%, 400% to 500%, 500% to 600%, 600% to 700%, 700% to 800%, or 900% to 1000% wider than the length 282 of the at least one support structure 200.

In one aspect, a width 604 of the element 600 is less than the width 284 of the at least one support structure 200. In one aspect, a width 604 of the element 600 is 10% to 600%, 10% to 100%, 100% to 200%, 200% to 300%, 300% to 400%, 400% to 500%, or 500% to 600% less than the width 284 of the at least one support structure 200.

In one aspect, the thickness 606 of the element 600 is the same as the thickness 286 of the pad 202.

In one aspect, the thickness 606 of the element 600 is less than the thickness 286 of the pad 202. In one aspect, the thickness 606 of the element 600 is 10% to 300%, 10% to 50%, 50% to 100%, 100% to 200%, or 200% to 300% less than the thickness 286 of the pad 202.

In one aspect, the thickness 606 of the element 600 is greater than the thickness 286 of the pad 202. In one aspect, the thickness 606 of the element 600 is 10% to 300%, 10% to 50%, 50% to 100%, 100% to 200%, or 200% to 300% greater than the thickness 286 of the pad 202.

In various aspects, the size of the element 600 size can be changed per a shape of the lead 102 and/or the stress relief feature 106, a location of the lead 102 and/or the stress relief feature 106, an RF device nature of the at least one electrical component 300, and/or the like.

In this regard, a substantial number of RF performance issues may be solved by adding the element 600. In various aspects, the element 600 improves the radio frequency performance. In various aspects, the element 600 improves the radio frequency performance including improving a return loss (S11).

Figure 17:
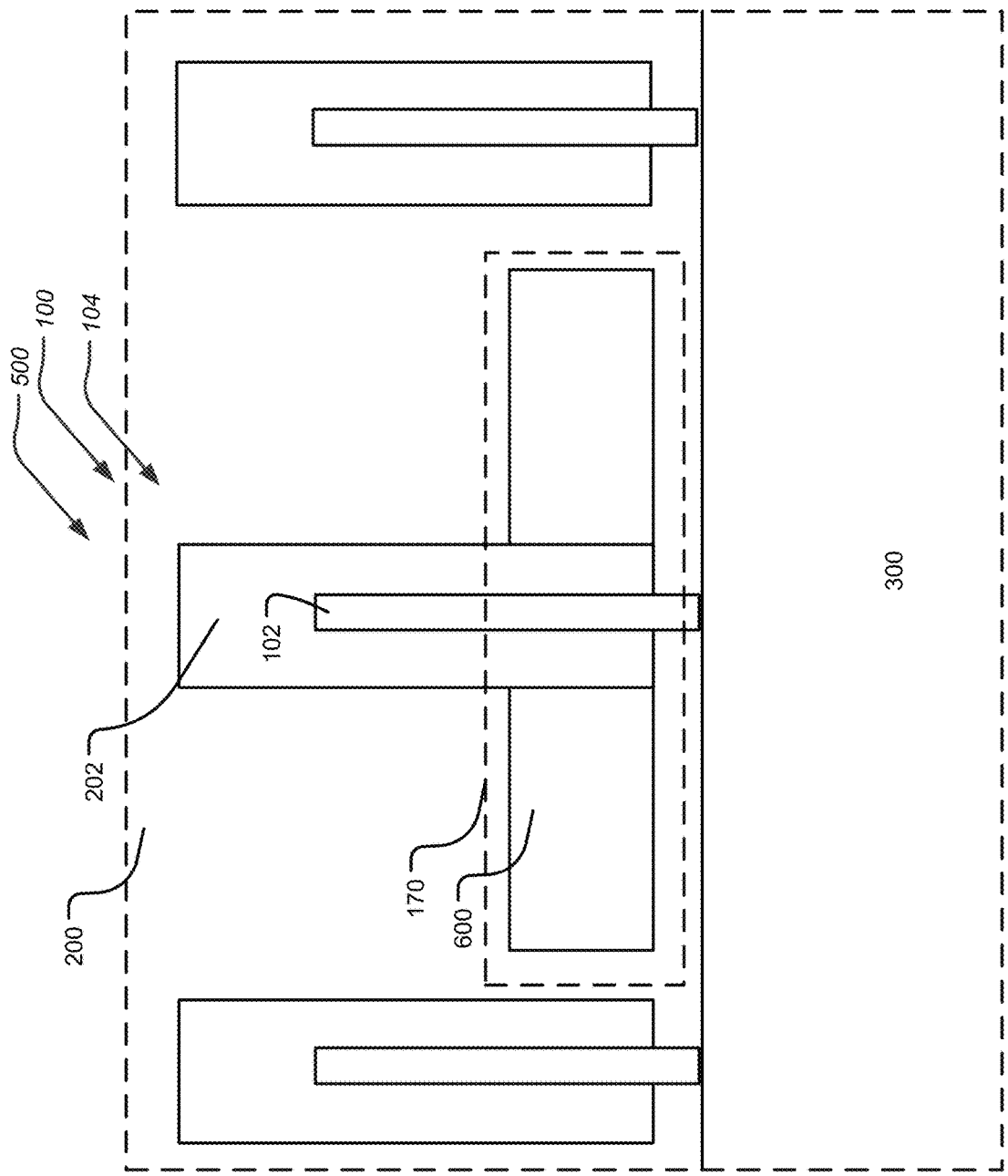
FIG. 17 illustrates a top view of the system according to FIG. 11.

FIG. 17 illustrates a top view of the system according to FIG. 11.

In particular, FIG. 17 illustrates the element 600 implemented by the system 100 as described herein. The element 600 being configured to alleviate signaling degradation realized by the lead 102 of the system 100. Additionally, in certain aspects, it may be beneficial to implement the at least one support structure 200 to include a zone 170 that includes the element 600. In particular, the zone 170 may be an area in the at least one support structure 200 that includes no additional features and/or a limited number of additional features. The additional features in the at least one support structure 200 may interfere with the element 600. In one aspect, the additional features in the at least one support structure 200 may create a capacitance between ground and the element 600.

In one aspect, the additional features of the at least one support structure 200 may include conducting lines, tracks, circuit traces, pads for connections, vias, and the like. Accordingly, in one or more aspects, the at least one support structure 200 may be implemented with the zone 170 that does not include any additional features and/or a limited number of additional features.

Figure 18:
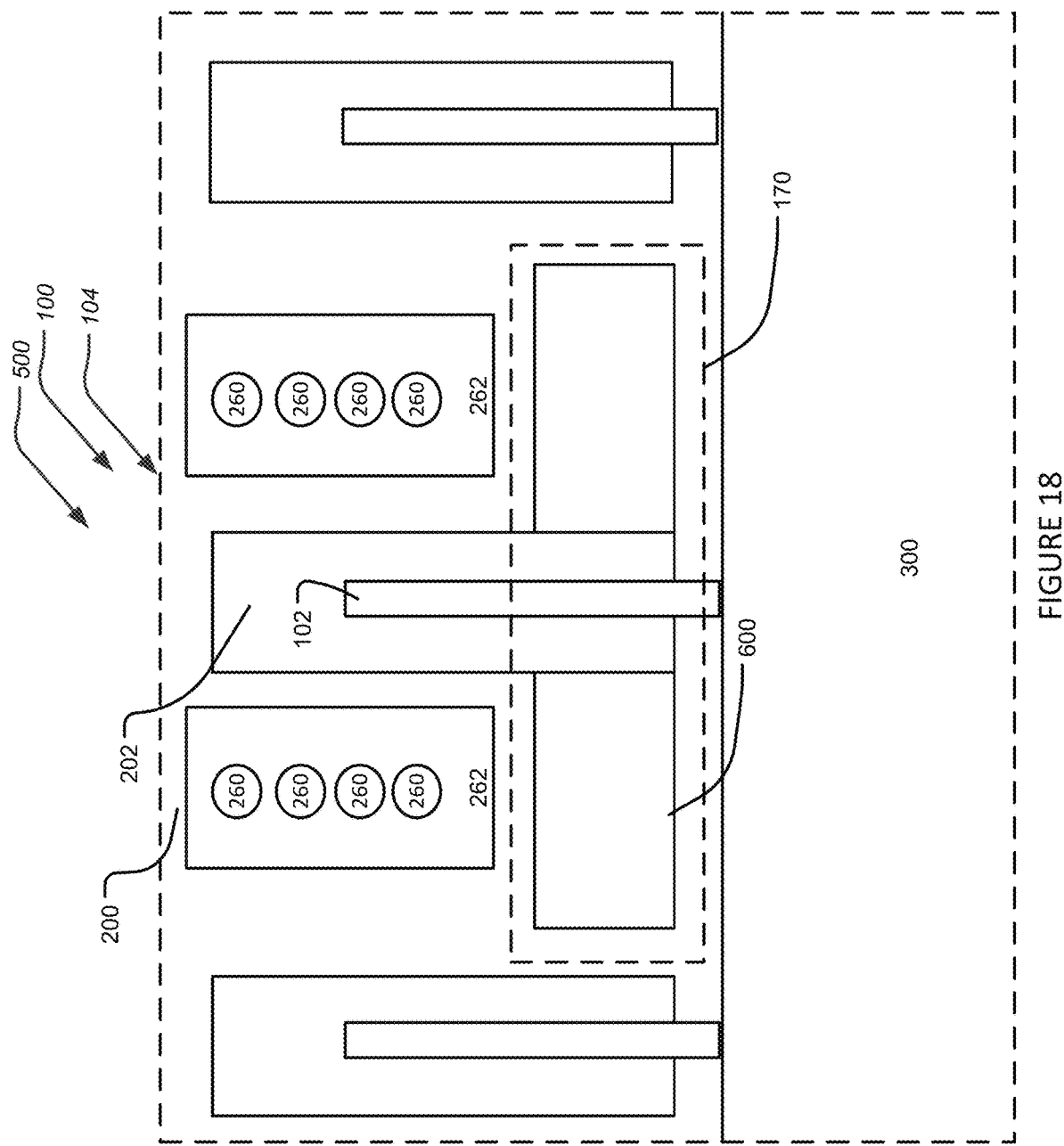
FIG. 18 illustrates a top view of the system according to FIG. 11.

FIG. 18 illustrates a top view of the system according to FIG. 11.

In particular, FIG. 18 illustrates the element 600 implemented by the system 100 as described herein. The element 600 being configured to alleviate signaling degradation realized by the lead 102 of the system 100. Additionally, in certain aspects, it may be beneficial to implement the at least one support structure 200 to include the zone 170 that includes the element 600. In particular, the zone 170 may be an area in the at least one support structure 200 that includes no additional features and/or a limited number of additional features. The additional features in the at least one support structure 200 may interfere with the element 600. In one aspect, the additional features in the at least one support structure 200 may create a capacitance between ground and the element 600.

As further illustrated in FIG. 18, the zone 170 does not include traces 262 and vias 260. In particular, the zone 170 that includes the element 600 may not include any additional features such as the traces 262, the vias 260, and/or the like.

In one aspect, the element 600 may be implemented in the at least one support structure 200 where the at least one support structure 200 is implemented as a Co-Planar Wave Guide (CPWG) PCB. In this regard, the element 600 may create a capacitance between ground and the element 600. In this aspect, the capacitance may be addressed by stopping at least the vias 260 in the zone 170 within a location of the element 600 as illustrated in FIG. 18.

In certain aspects, the element 600 implemented in the at least one support structure 200 implemented as a CPWG PCB may maintain the benefits of a CPWGs that include a small size, low cost, ease of manufacturing, easy access to signal line, lower dispersion, and the like, while improving signal performance including return loss (S11).

Figure 19:
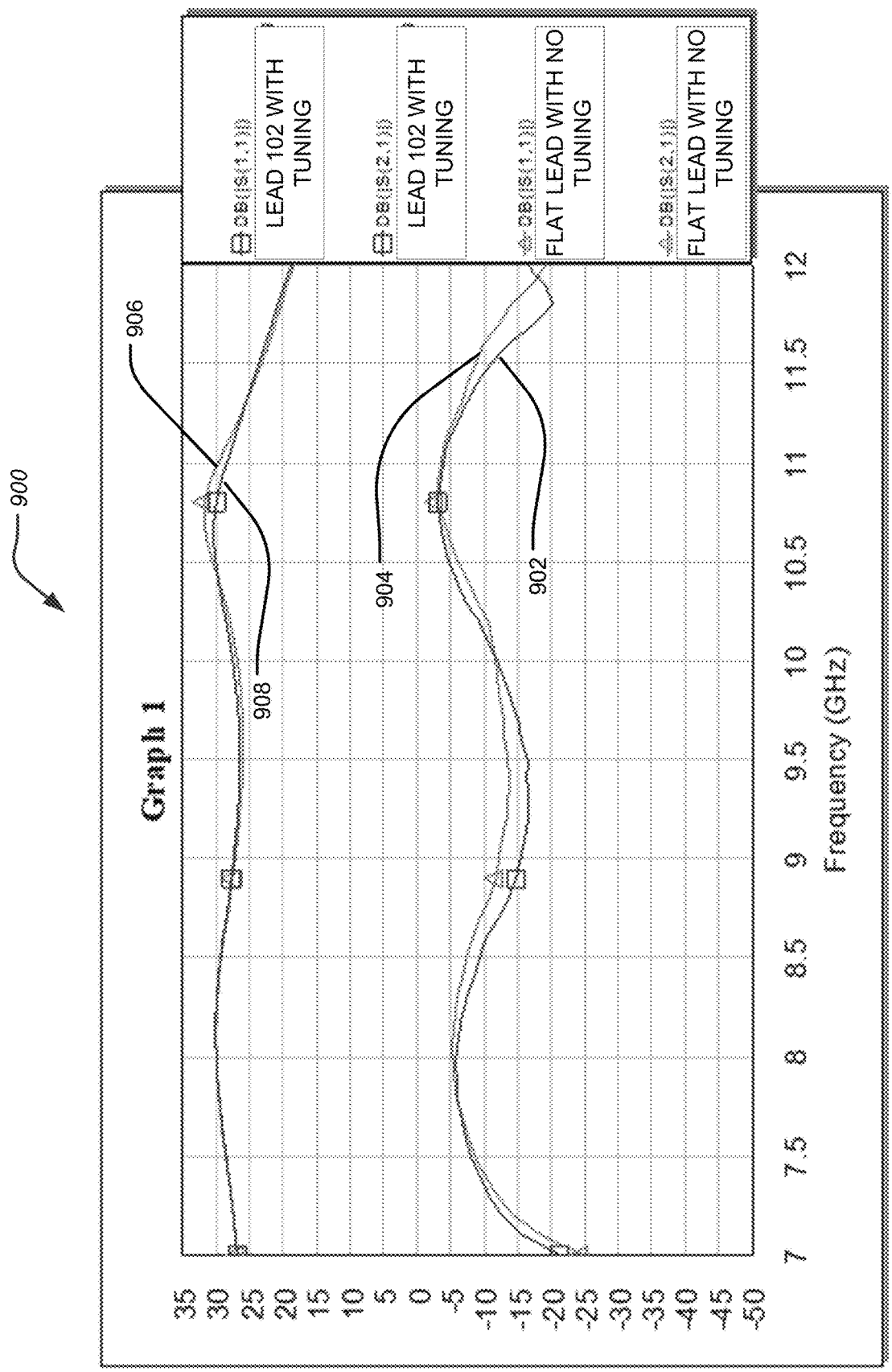
FIG. 19 illustrates a graph showing an improved signaling performance according to aspects of the disclosure.

FIG. 19 illustrates a graph showing an improved signaling performance according to aspects of the disclosure.

In particular, FIG. 19 illustrates that the system 100 implementing the lead 102, the stress relief feature 106, the element 600, the zone 170, and the like provide commensurate signaling performance based on a bivariate fit of S11 (dB) by frequency (GHz) to that of implementations with a flat lead in particular implementations.

More specifically, FIG. 19 illustrates a plot 900 that is a comparison of the lead 102 with tuning versus a flat lead without tuning. As shown in FIG. 19, the plot 900 demonstrates that even with implementation of the lead 102 having a bent configuration (the lead 102 with stress relief feature 106), the disclosed system may have performance equivalent to that of the flat lead without tuning.

With reference to FIG. 19, traces 904, 906 relate to a flat lead without tuning and traces 902, 908 relate to bent leads (lead 102 with stress relief feature 106) with tuning. In particular, the trace 908 is a gain of the device with the bent lead (lead 102 with stress relief feature 106) with tuning, the trace 902 is the return loss (how much signal is lost by reflection) of the device with the bent lead (lead 102 with stress relief feature 106) with tuning, the trace 906 is the gain of the device with a flat lead without tuning, and the trace 904 is the return loss of the device with a flat lead without tuning.

Figure 20:
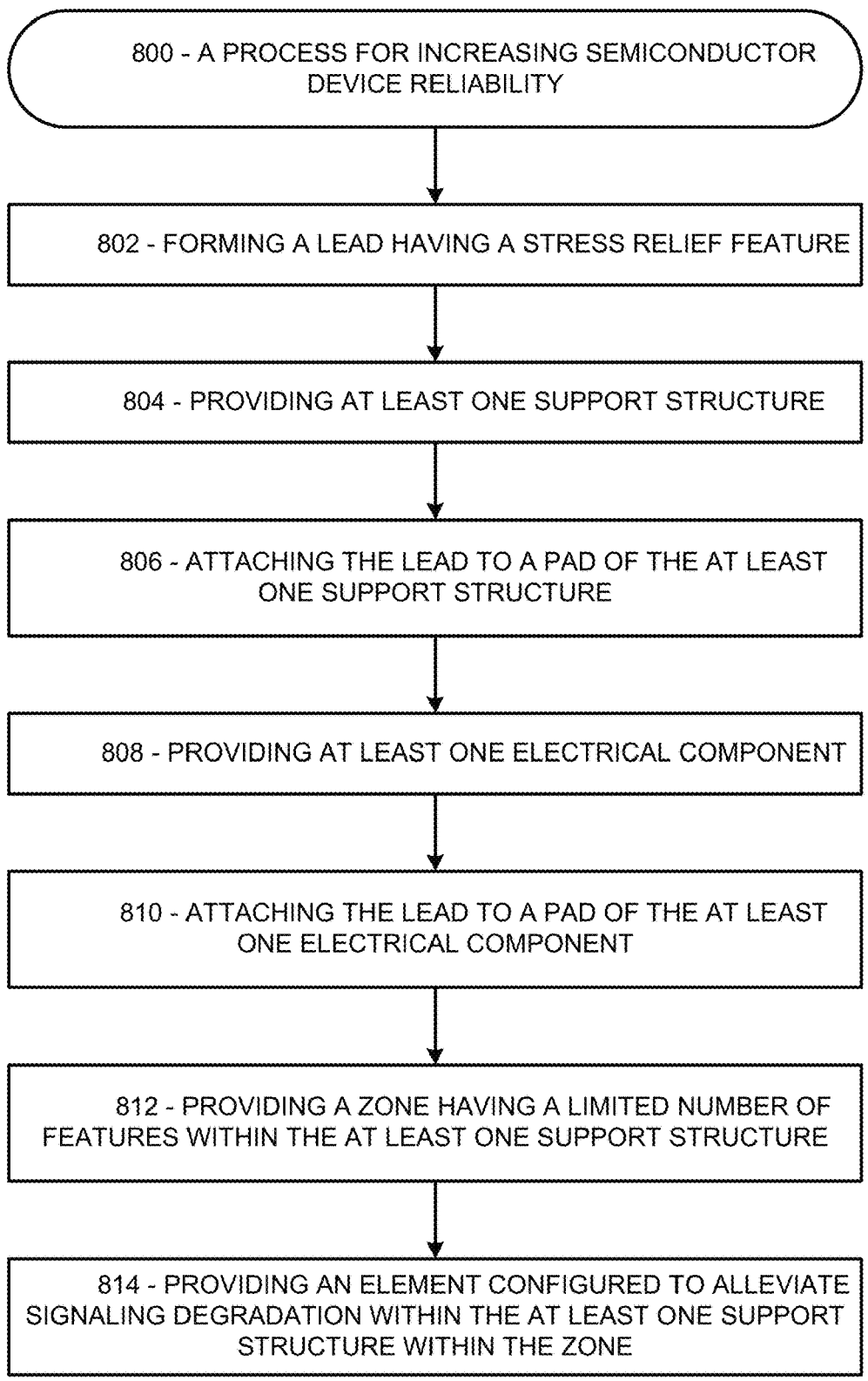
FIG. 20 illustrates a process of implementing a system according to aspects of the disclosure.
Figure 21:
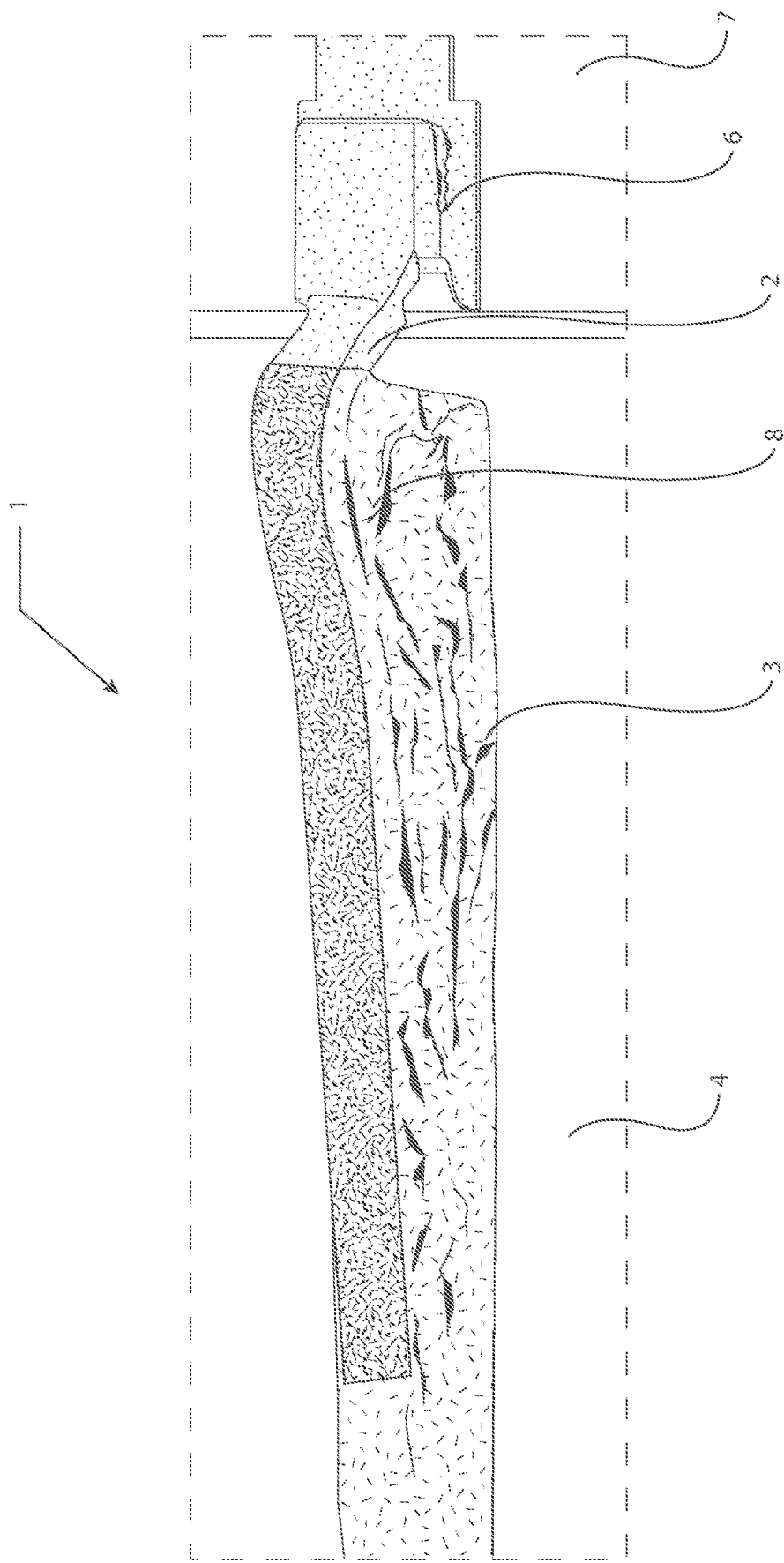
FIG. 21 illustrates an exemplary defect in a lead.
Figure 22:
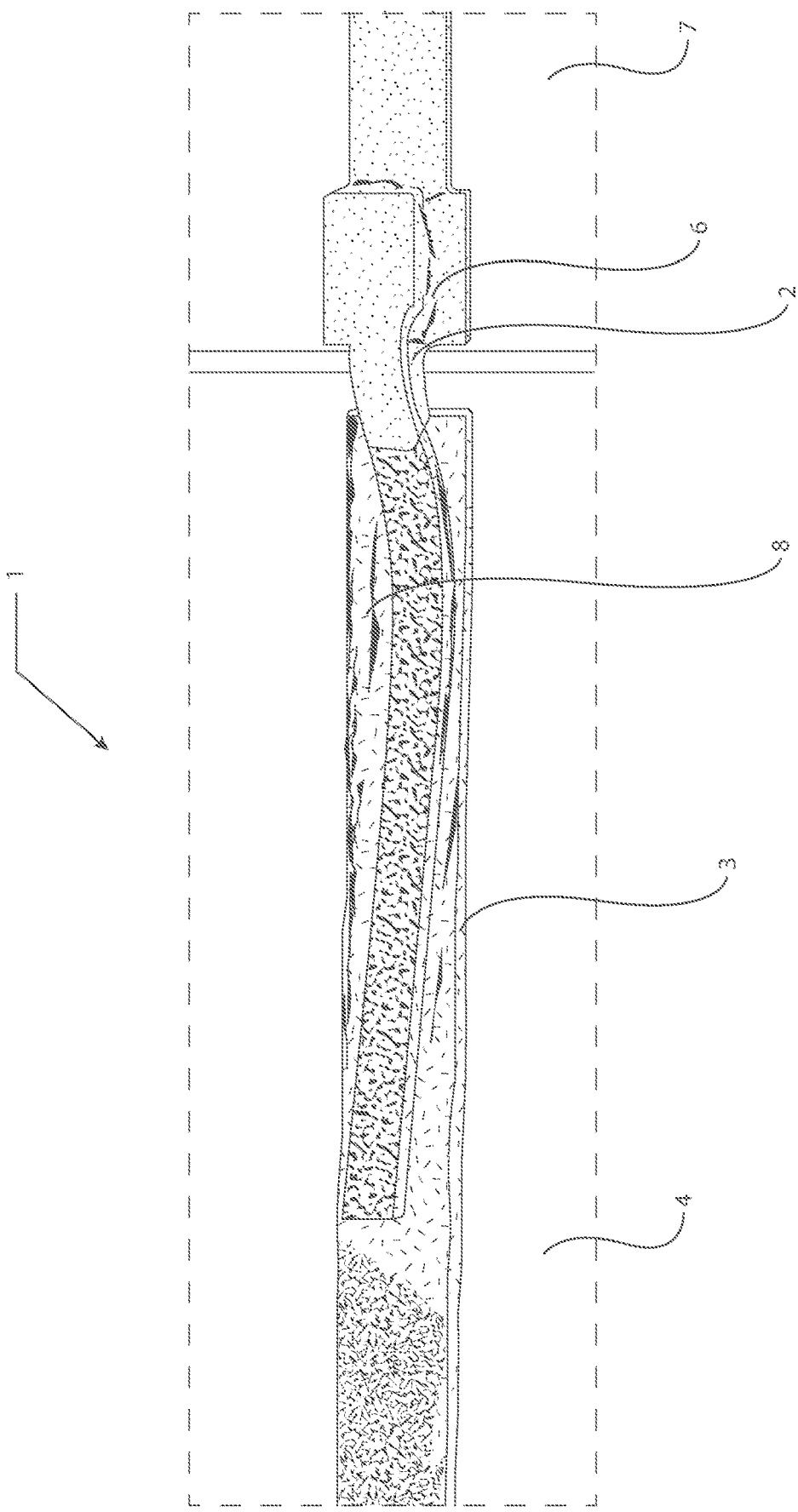
FIG. 22 illustrates an exemplary defect in a lead.
Figure 23:
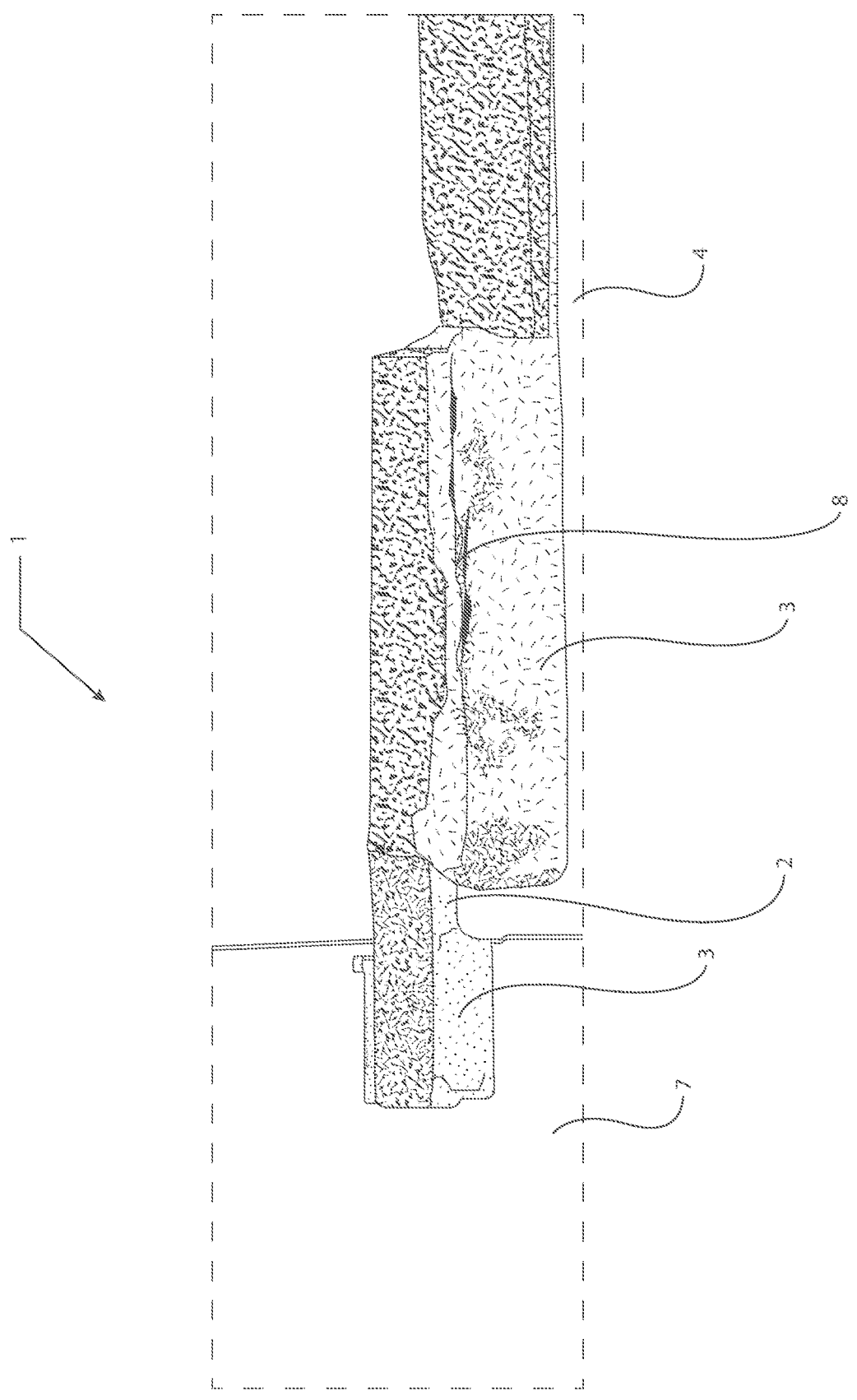
FIG. 23 illustrates an exemplary defect in a lead.

FIG. 20 illustrates a process of implementing a system according to aspects of the disclosure.

In particular, FIG. 20 illustrates a process for increasing semiconductor device reliability 800.

As illustrated in box 802, the lead 102 having the stress relief feature 106 may be formed. In one aspect, the lead 102 may be formed with a forming tool as described herein.

The lead 102 may be formed with various shapes of as described herein. The lead 102 may include a pad connection portion 116. The pad connection portion 116 may include the lower surface 114 arranged on the lower surface thereof. The pad connection portion 116 may further include an upper surface 118. The lead 102 may include a pad connection portion 126. The pad connection portion 126 may include the lower surface 124 arranged on the lower surface thereof. The pad connection portion 126 may further include an upper surface 128. The lead 102 may include an upper portion 130. The upper portion 130 may include a lower surface 132 arranged on a lower surface thereof. The upper portion 130 may include an upper surface 134 arranged on the upper surface thereof.

The lead 102 may include a connection portion 140 that connects between the pad connection portion 116 and the upper portion 130. The connection portion 140 may have an upper surface and a lower surface.

The lead 102 may include a connection portion 142 that connects between the pad connection portion 126 and the upper portion 130. The connection portion 142 may have an upper surface and a lower surface.

The lead 102 may further include any and all features, configurations, arrangements, implementations, aspects and/or the like as described herein.

As illustrated in box 804, the at least one support structure 200 may be provided. In one or more aspects, the at least one support structure 200 may be configured to mechanically support and electrically connect the at least one electrical component 300 and other electronic components. In one or more aspects, the at least one support structure 200 may include conductive tracks, pads, the pad 202, and other features. The at least one support structure 200 may further include any and all features, configurations, arrangements, implementations, aspects and/or the like as described herein.

As illustrated in box 806, a lead—solder interface 208 may be formed between the lead 102 and the pad 202 for attachment of the lead 102 to the pad 202 of the at least one support structure 200. In particular, the lead 102 may have a lower surface 114 and the lead—solder interface 208 may be formed between the lower surface 114 and the upper surface 206 of the pad 202.

The attachment of the lead 102 to the at least one support structure 200 may further include any and all features, configurations, arrangements, implementations, aspects and/or the like as described herein.

As illustrated in box 808, the at least one electrical component 300 may be provided. The at least one electrical component 300 may include any electrical component for any application. In one aspect, the at least one electrical component 300 may be an RF (Radio Frequency) component. In one aspect, the at least one electrical component 300 may be a silicon-carbide Schottky diode, a MOSFET (metal-oxide-semiconductor field-effect transistor), a power module, a gate driver, and the like. In one aspect, the at least one electrical component 300 may be an RF (Radio Frequency) component such as a General-Purpose Broadband component, a Telecom component, a L-Band component, a S-Band component, a X-Band component, a C-Band component, a Ku-Band component, a Satellite Communications component, and the like. In one aspect, the at least one electrical component 300 may be a high-electron mobility transistor (HEMT). The at least one electrical component 300 may further include any and all features and aspects as described herein.

As illustrated in box 810, a lead—solder interface 308 may be formed between the lead 102 and the pad 302 for attaching the lead 102 to the at least one electrical component 300. In particular, the lead 102 may have a lower surface 124 and the lead—solder interface 308 may be formed between the lower surface 124 and the pad 302. The attachment of the lead 102 to the at least one electrical component 300 may further include any and all features, configurations, arrangements, implementations, aspects and/or the like as described herein.

As illustrated in box 812 the zone 170 may be provided. In particular, the zone 170 may be an area in the at least one support structure 200 that includes no additional features and/or a limited number of additional features.

The zone 170 may further include any and all features, configurations, arrangements, implementations, aspects and/or the like as described herein.

As illustrated in box 814, the element 600 may be provided.

In one aspect, the element 600 may be implemented with a metallic pad that is electrically connected to the pad 202. In one aspect, the element 600 may be implemented with a metallic pad that is electrically isolated from the pad 202. In one aspect, the element 600 may add a shunt capacitance, which counteracts an additional parasitic inductance caused by the lead 102 and/or the stress relief feature 106.

The element 600 may further include any and all features, configurations, arrangements, implementations, aspects and/or the like as described herein.

Accordingly, the system 100 as disclosed including the lead 102, the stress relief feature 106, the element 600, the zone 170, and/or the like reduces the stress in the lead—solder interface 208 and the lead—solder interface 308.

Additionally, the system 100 as disclosed including the lead 102, the stress relief feature 106, the element 600, the zone 170, and/or the like reduces solder fatigue in the lead—solder interface 208 and the lead—solder interface 308.

Additionally, the system 100 as disclosed including the lead 102, the stress relief feature 106, the element 600, the zone 170, and/or the like reduces defects in the lead—solder interface 208 and the lead—solder interface 308.

Additionally, the system 100 as disclosed including the lead 102, the stress relief feature 106, the element 600, the zone 170, and/or the like reduces failure modes and defects such as cracks, fatigue features, fractures, delamination, and/or the like in the connection between one or more of the lead 102, the lead—solder interface 208, the lead—solder interface 308, the pad 202, the pad 302, and the like.

Additionally, the system 100 as disclosed including the lead 102, the stress relief feature 106, the element 600, the zone 170, and/or the like ensures a greater number of the devices 500 passing thermal shock tests, temperature cycle tests, and/or the like.

Moreover, the system 100 as disclosed including the lead 102, the stress relief feature 106, elements 600, the zone 170, and/or the like ensures signaling performance of the device 500 is maintained at a high level, is not substantially degraded, and the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A system configured to increase a reliability of electrical connections in a device, the system comprising:
a lead configured to electrically connect a pad of at least one support structure to a pad of at least one electrical component;
the lead includes a first pad connection portion that includes a first upper surface;
the first pad connection portion configured to connect the lead to the pad of at least one support structure;
the lead includes a second pad connection portion that includes a second upper surface;
the second pad connection portion configured to connect the lead to the pad of at least one electrical component;
the lead includes an upper portion that includes a lower surface arranged on a lower surface thereof;
the upper portion being arranged between the first pad connection portion and the second pad connection portion; and
an element configured to alleviate signaling degradation through the lead,
wherein the lower surface of the upper portion is arranged vertically above the first upper surface of the first pad connection portion;
wherein the lower surface of the upper portion is arranged vertically above the second upper surface of the second pad connection portion; and
wherein the element is arranged under the lead.

2. The system according to claim 1 wherein the element comprises at least one of the following: a metallic portion, a metallic component, and/or a metallic pad.

3. The system according to claim 1 wherein a width of the element is greater than a width of the pad of at least one support structure.

4. The system according to claim 1 further comprising:
at least one support structure; and
wherein the element comprises a metallic construction; and
wherein the element is arranged in one of the following: on the at least one support structure or within the at least one support structure.

5. The system according to claim 4 wherein:
the at least one support structure comprises a zone that includes a limited number of additional features; and
the element is arranged in the zone.

6. The system according to claim 5 wherein:
the at least one support structure comprises a Co-Planar Wave Guide (CPWG) printed circuit board (PCB) having vias; and
the zone that includes the element does not include the vias.

7. The system according to claim 6 further comprising at least one electrical component,
wherein the electrical component comprises an RF (Radio Frequency) component.

8. The system according to claim 1 wherein the upper portion comprises a curved convex construction.

9. The system according to claim 1 wherein:
the lead is configured to reduce stress in a first lead—solder interface arranged between the first pad connection portion of the lead and the pad of at least one support structure; and the lead is configured to reduce stress in a second lead—solder interface arranged between the second pad connection portion of the lead and the pad of at least one electrical component.

10. The system according to claim 1 wherein:
the lead includes a first connection portion that connects between the first pad connection portion and the upper portion; and
the lead includes a second connection portion that connects between the second pad connection portion and the upper portion,
wherein portions of the first connection portion are arranged vertically above the first upper surface of the first pad connection portion; and
wherein portions of the second connection portion are arranged vertically above the second upper surface of the second pad connection portion.

11. The system according to claim 1 wherein
the lead includes a first connection portion that connects between the first pad connection portion and the upper portion; and
the lead includes a second connection portion that connects between the second pad connection portion and the upper portion,
wherein the first connection portion and the second connection portion each comprise a concave construction.

12. The system according to claim 1 wherein:
the lead includes a first end portion and a second end portion;
the first end portion forming a terminating end of the lead and the second end portion forming another terminating end of the lead; and
a curved distance from the first end portion to the second end portion along the lead is greater than a linear distance from the first end portion to the second end portion.

13. A process configured to increase a reliability of electrical connections in a device, the process comprising:
forming a lead that is configured to electrically connect a pad of at least one support structure to a pad of at least one electrical component;
providing the lead with a first pad connection portion that includes a first upper surface;
configuring the first pad connection portion to connect the lead to the pad of at least one support structure;
providing the lead with a second pad connection portion that includes a second upper surface;
configuring the second pad connection portion to connect the lead to the pad of at least one electrical component;
arranging the lead to include an upper portion that includes a lower surface arranged on a lower surface thereof;
arranging the upper portion between the first pad connection portion and the second pad connection portion;
arranging the lower surface of the upper portion to be vertically above the first upper surface of the first pad connection portion;
arranging the lower surface of the upper portion to be arranged vertically above the second upper surface of the second pad connection portion; and
arranging an element configured to alleviate signaling degradation through the lead,
wherein the element is arranged under the lead.

14. The process according to claim 13 wherein the element comprises at least one of the following: a metallic portion, a metallic component, and/or a metallic pad.

15. The process according to claim 13 wherein a width of the element is greater than a width of the pad of at least one support structure.

16. The process according to claim 13 further comprising:
providing at least one support structure; and
wherein the element comprises a metallic construction; and
wherein the element is arranged in one of the following: on the at least one support structure or within the at least one support structure.

17. The process according to claim 16 further comprising:
forming a zone that includes a limited number of additional features in the at least one support structure; and
arranging the element in the zone.

18. The process according to claim 17 wherein:
the at least one support structure comprises a Co-Planar Wave Guide (CPWG) printed circuit board (PCB) having vias; and
the zone that includes the element does not include the vias.

19. The process according to claim 18 further comprising providing at least one electrical component,
wherein the electrical component comprises an RF (Radio Frequency) component.

20. The process according to claim 13 further comprising forming the upper portion to have a curved convex construction.

21. The process according to claim 13 further comprising:
implementing the lead to reduce stress in a first lead—solder interface arranged between the first pad connection portion of the lead and the pad of at least one support structure; and
implementing the lead to reduce stress in a second lead—solder interface arranged between the second pad connection portion of the pad of at least one electrical component.

22. The process according to claim 13 further comprising:
configuring the lead to include a first connection portion that connects between the first pad connection portion and the upper portion;
configuring the lead to include a second connection portion that connects between the second pad connection portion and the upper portion;
arranging portions of the first connection portion vertically above the first upper surface of the first pad connection portion; and
arranging portions of the second connection portion vertically above the second upper surface of the second pad connection portion.

23. The process according to claim 13 wherein
arranging the lead to include a first connection portion that connects between the first pad connection portion and the upper portion;
arranging the lead to include a second connection portion that connects between the second pad connection portion and the upper portion; and
configuring the first connection portion and the second connection portion to each have a concave construction.

24. The process according to claim 13 further comprising:
configuring the lead to include a first end portion and a second end portion, the first end portion forming a terminating end of the lead and the second end portion forming another terminating end of the lead; and
configuring the lead such that a curved distance from the first end portion to the second end portion along the lead is greater than a linear distance from the first end portion to the second end portion.

* * * * *